(12) United States Patent
Kramer

(10) Patent No.: US 10,420,237 B1
(45) Date of Patent: Sep. 17, 2019

(54) EASY ACCESS ALARM MOUNT

(71) Applicant: Kramer Cartridge & Carbine LLC, Las Vegas, NV (US)

(72) Inventor: Lawrence S. Kramer, Las Vegas, NV (US)

(73) Assignee: Lawrence S. Kramer, Las Vegas, NV (US)

( * ) Notice: Subject to any disclaimer, the term of this patent is extended or adjusted under 35 U.S.C. 154(b) by 0 days.

(21) Appl. No.: 15/928,641

(22) Filed: Mar. 22, 2018

(51) Int. Cl.
*H05K 5/03* (2006.01)
*H05K 5/02* (2006.01)
*G08B 17/10* (2006.01)

(52) U.S. Cl.
CPC .............. *H05K 5/03* (2013.01); *G08B 17/10* (2013.01); *H05K 5/0221* (2013.01); *H05K 5/0226* (2013.01)

(58) Field of Classification Search
CPC ........................................................ H05K 5/03
USPC ......................................... 340/693.9; 174/66
See application file for complete search history.

(56) References Cited

U.S. PATENT DOCUMENTS

| | | | |
|---|---|---|---|
| 2,208,486 A * | 7/1940 | Aldeen ................. | E05C 19/063 16/85 |
| 3,129,024 A * | 4/1964 | Schuessler ............. | E05C 17/52 292/15 |
| 9,070,263 B1 * | 6/2015 | Peeters .................... | G08B 1/08 |
| 2012/0006577 A1 * | 1/2012 | Brantley ................. | H02G 3/14 174/67 |

* cited by examiner

*Primary Examiner* — Jack K Wang
(74) *Attorney, Agent, or Firm* — Patterson + Sheridan, LLP

(57) ABSTRACT

An easy access alarm mount including a cover having a hinge mechanism and a cover locking mechanism and a base with a hinge mechanism recess and base locking mechanism is provided. The engagement of the hinge mechanism with the hinge mechanism recess and the base locking mechanism with the cover locking mechanism allows the base and cover to be coupled together. The cover may further include a beveled access wand recess to allow an access wand to engage with the cover to allow the cover to be attached or detached by the access wand.

20 Claims, 15 Drawing Sheets

EASY ACCESS ALARM MOUNT

BACKGROUND

Field

Embodiments of the present disclosure generally relate to a mount for residential and commercial smoke alarms and detectors.

Description of the Related Art

Residential smoke alarms currently in use are designed with a two piece design. The design usually has a plastic ring or base that is attached to the ceiling and a detector body containing the alarm unit. The detector body screws or rotates into the ring shaped base. These designs are typically plugged directly into the structures electrical system and have a backup battery.

When alarms or detectors utilizing this type of design require service or a battery change, the alarms or detectors are accessed directly by an individual who physically unscrews the alarm body from the base and disengages the electrical power connection to the unit. A ladder is often required to access the alarm unit since most alarms are mounted on the ceiling or high on a wall. A tall ladder may be necessary to reach alarm units located on cathedral or vaulted ceilings. Many residents living in apartments and renters of single family homes do not own a ladder or have access to a ladder tall enough to access these alarms.

When the alarms battery charge gets low the occupant is alerted by an intermittent "chirping". If the occupant cannot access the alarm to replace the battery or silence it, the occupant might try to silence the alarm by knocking the alarm off the alarm's base with a broom handle or similar device that is long enough to reach the alarm or detector. While this might stop the chirping, the area will be unprotected in the event of a subsequent hazardous event if the unit is not replaced. Elderly or physically disabled persons are sometimes unable to access alarms or detectors that utilize these types of mounts. Alarms may also be removed or deactivated due to nuisance activations, such as a fire alarm close to the kitchen that repeatedly goes off while cooking.

SUMMARY

In one embodiment, a modular alarm unit having a cover and a base is provided. The cover has a cover locking mechanism, and a hinge mechanism disposed at a first end of the cover. The hinge mechanism has at least one hinge tab. The base has a base locking mechanism and a hinge mechanism recess. The base locking mechanism is configured to engage with the corresponding cover locking mechanism to lock the base to the cover. The hinge mechanism recess is disposed at one end of the base, the hinge mechanism recess having at least one recess, wherein the hinge mechanism recess is configured to receive the hinge mechanism. The cover is configured to be coupled to the base by the engagement of the hinge mechanism with the hinge mechanism recess and the engagement of the cover locking mechanism with the base locking mechanism.

In one embodiment, a modular alarm unit having a cover, a base, and an access wand is provided. The cover has a cover locking mechanism and a beveled access wand recess. The base has a base locking mechanism. The access wand has a cover engagement mechanism configured to engage the cover at the beveled access wand recess.

In one embodiment, an access wand for use with a modular alarm unit is provided. The access wand having a tubular body, a lever movable from a first position to a second position, an actuation cable disposed in the tubular body, and a cover engagement mechanism having at least two latches. The cover engagement mechanism has an extended position and an unextended position. The actuation cable is attached to the lever at one end and to the cover engagement mechanism at the other end.

In one embodiment, a notification module having a housing is provided. The housing has a battery power level display, and a microprocessor disposed in the housing. The microprocessor is in communication with an alarm system and the battery power level display. The alarm system has a battery. The microprocessor detects a battery power level of the battery and displays the battery power level on the battery power level display.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

DETAILED DESCRIPTION

Figure 13:
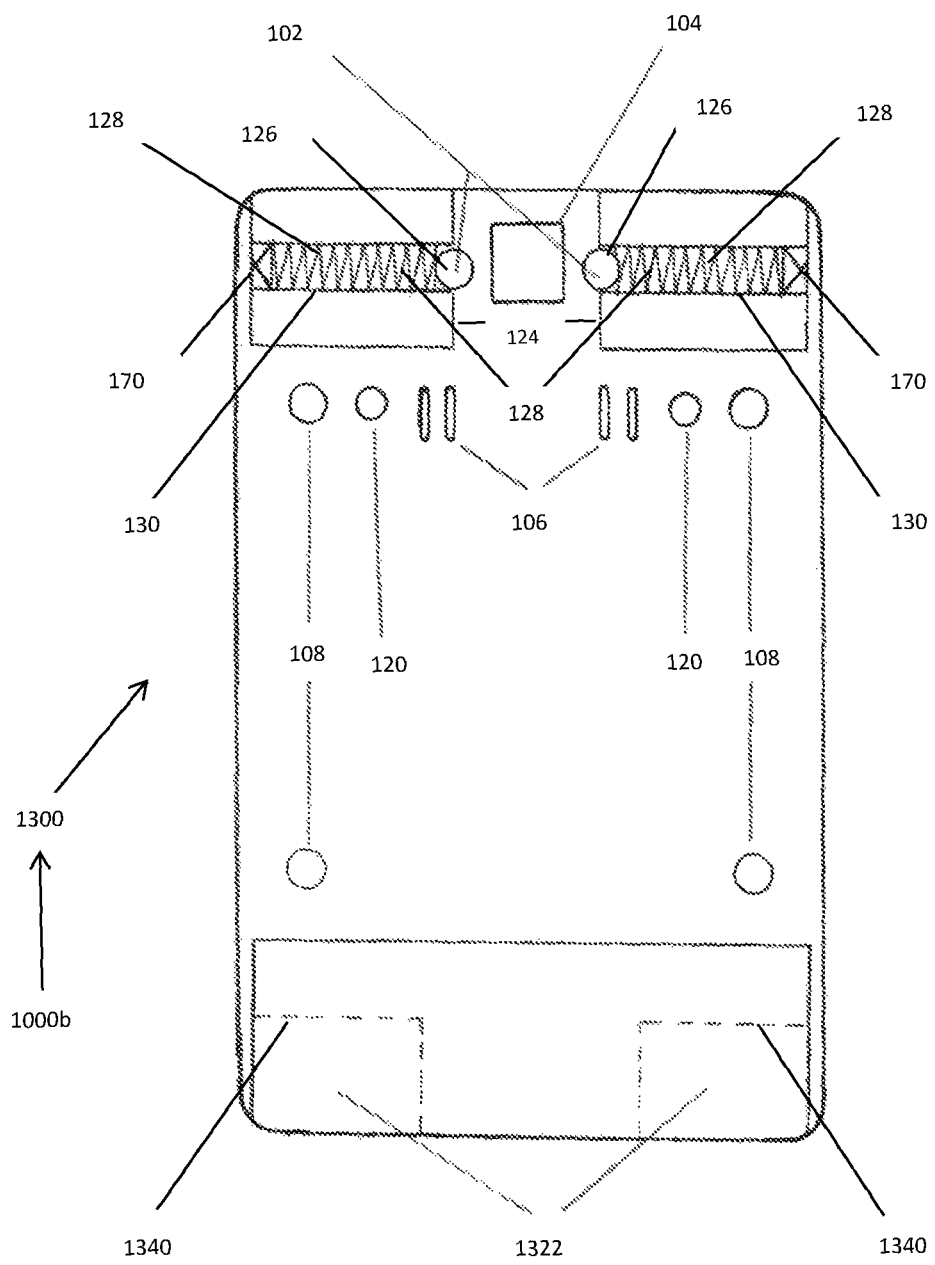
FIG. 13 illustrates a top view of the base of an easy access alarm mount having a hinge mechanism recess with two recesses, according to one embodiment disclosed herein.
Figure 14:
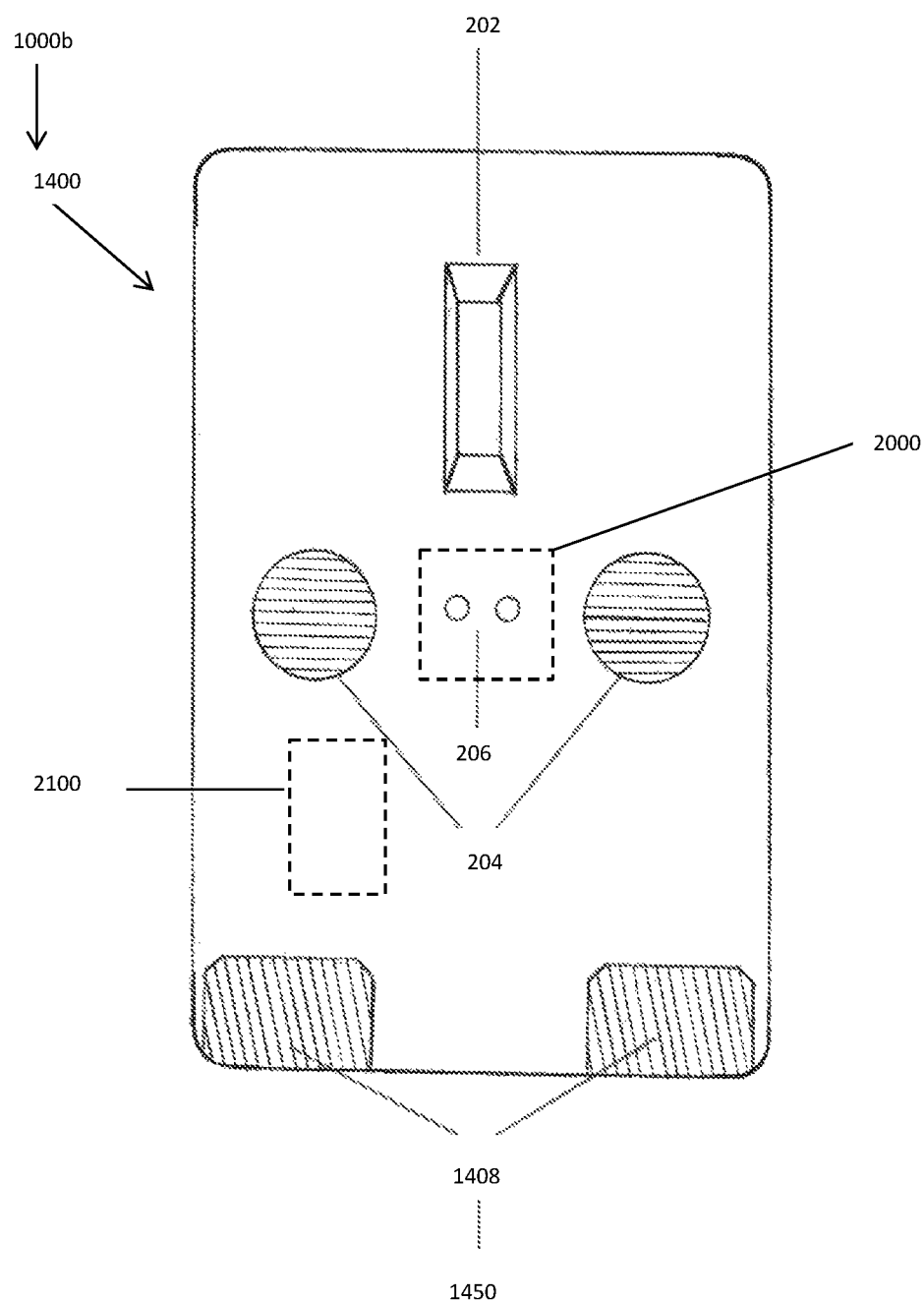
FIG. 14 illustrates a top view of the cover of an easy access alarm mount with a hinge locking mechanism having two hinge tabs, according to one embodiment disclosed herein.
Figure 15:
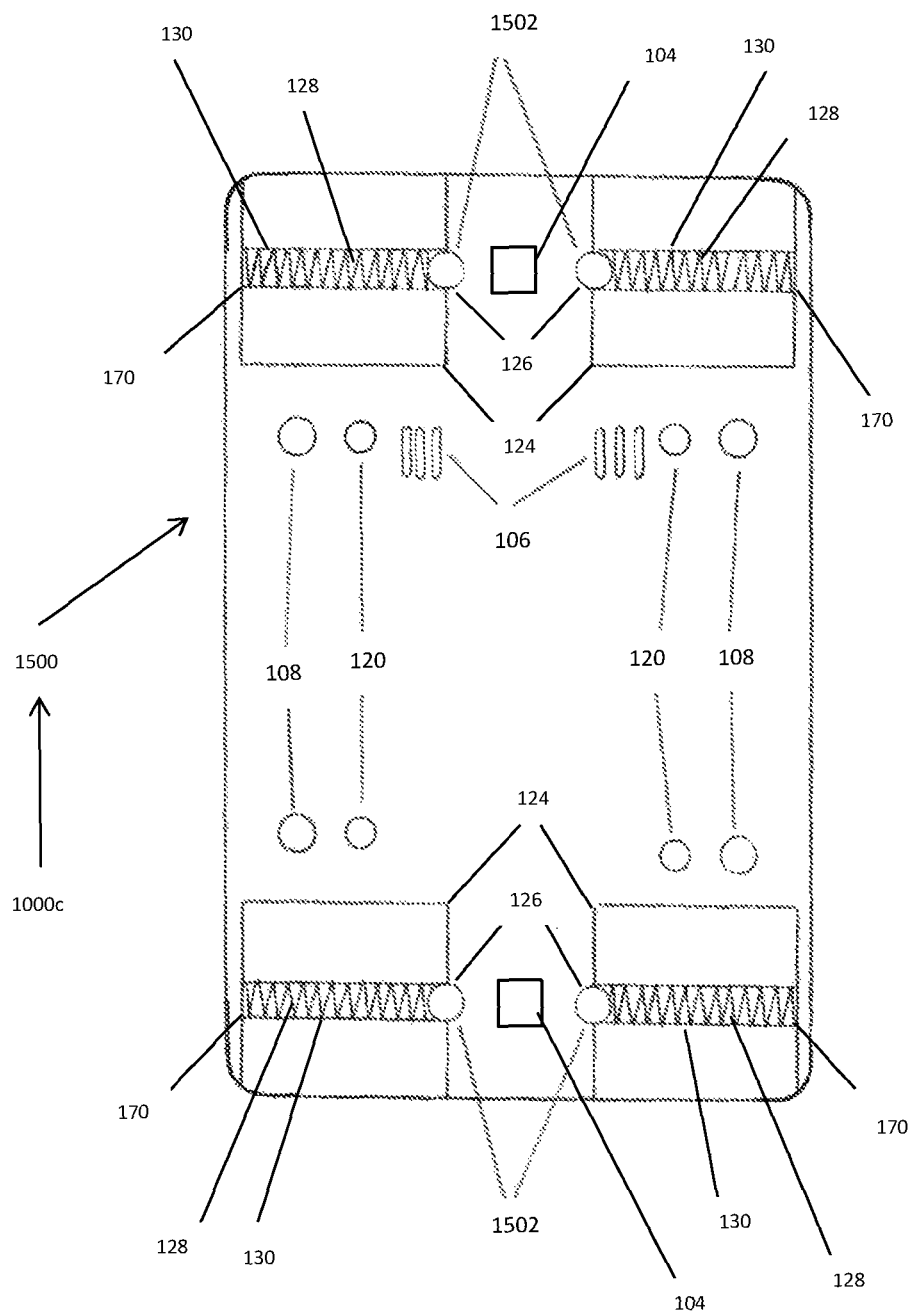
FIG. 15 illustrates a top view of the base of an easy access alarm mount coupled to the cover by direct attachment, according to one embodiment disclosed herein.
Figure 16:
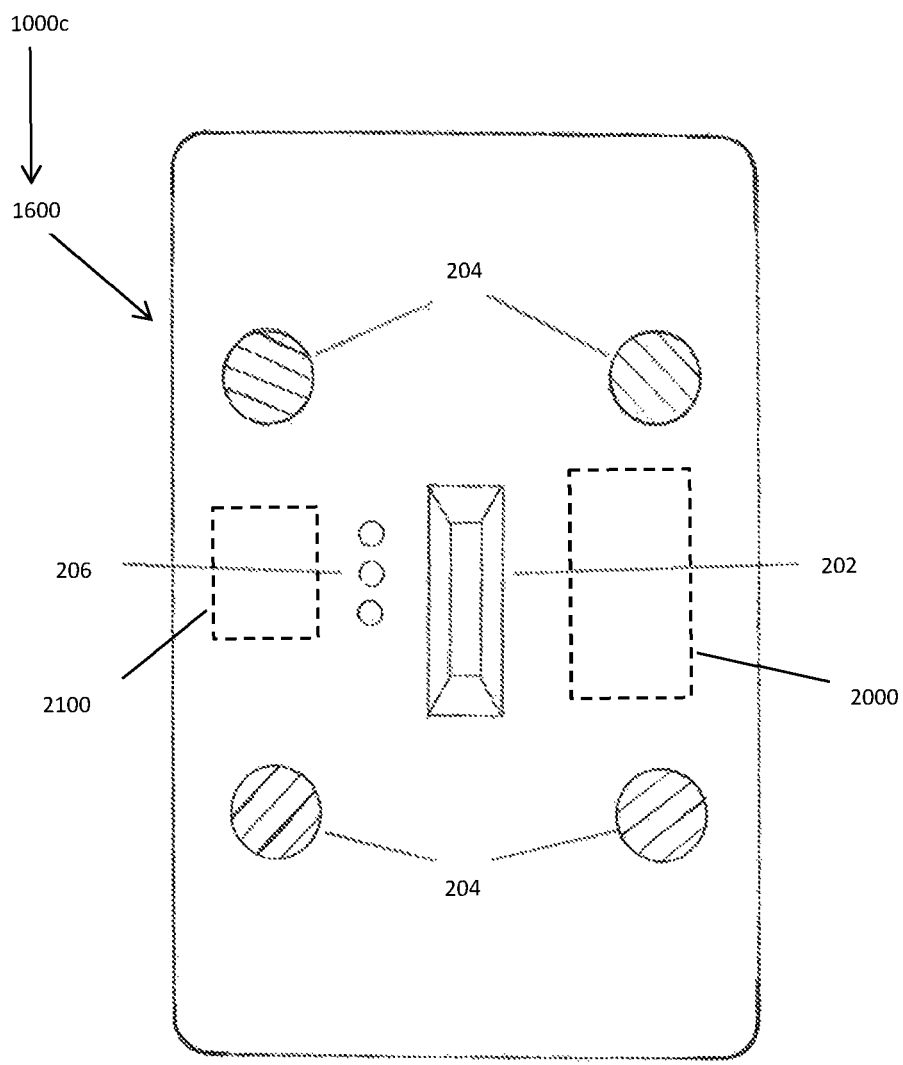
FIG. 16 illustrates a top view of the cover of an easy access alarm mount which is coupled to the base by direct attachment, according to one embodiment disclosed herein.

The Easy Access Alarm Mount (EAAM) unit is a modular alarm unit having a two piece design with a base 100 and cover 200. FIG. 1-6 illustrate one embodiment of the EAAM 1000 having a cover 200 with a hinge mechanism 250 with one hinge tab and base 100 with a hinge mechanism recess 122 that is a single recess. FIGS. 7-12 illustrate one embodiment of the EAAM 1000a having a cover 800 with a hinge mechanism 250 having one hinge tab and having a base 700 with a hinge mechanism recess 122 that is a single recess. FIGS. 13-14 illustrate one embodiment of the EAAM 1000b having a cover 1400 with a hinge mechanism 1450 having two hinge tabs 250 and having a base 1300 with a hinge mechanism recess 1322 that is two individual recesses. FIG. 15-16 illustrate one embodiment of the EAAM 1000c without a hinge mechanism or a hinge mechanism recess.

Figure 1:
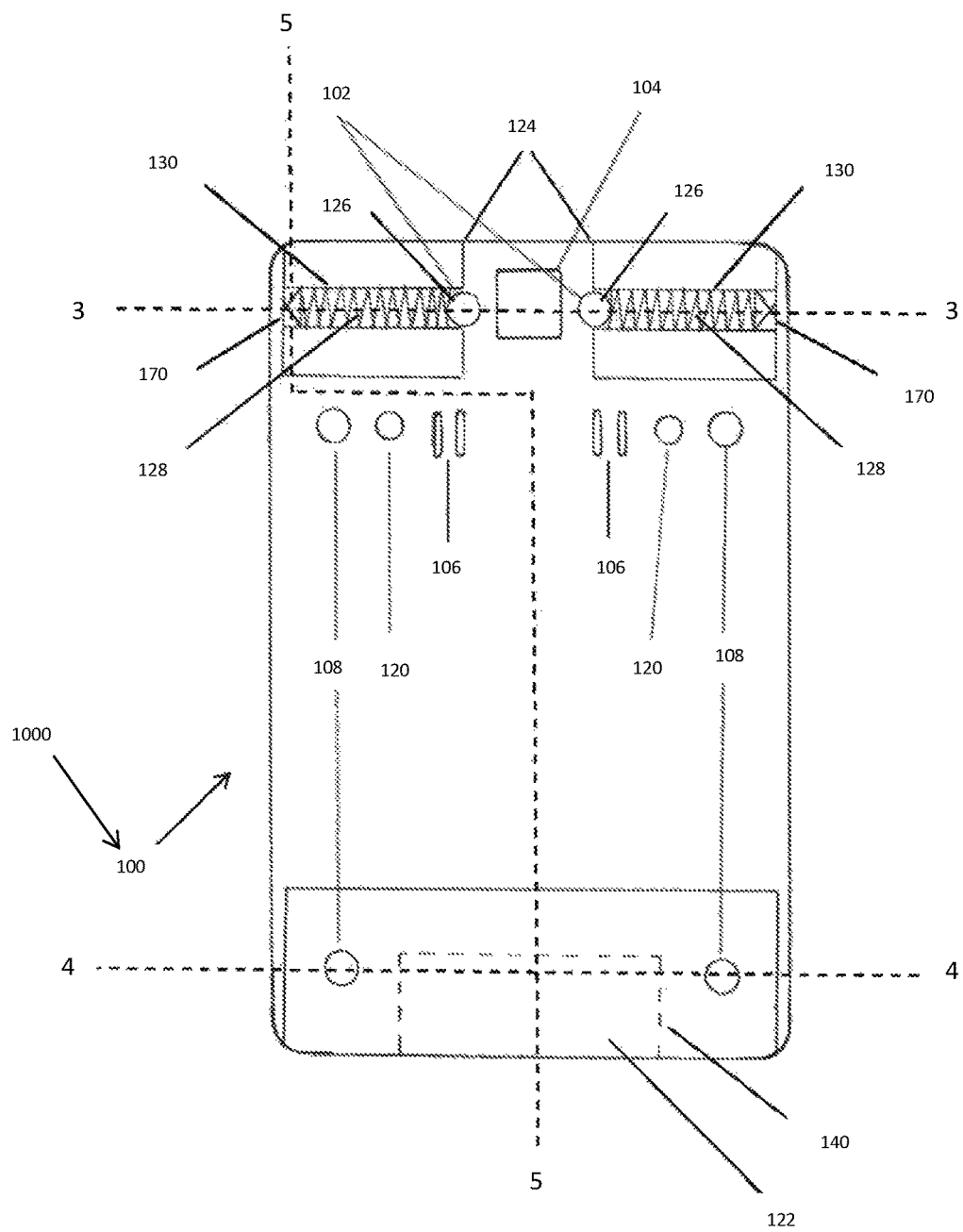
FIG. 1 illustrates a top view of the base of an easy access alarm mount, according to one embodiment disclosed herein.
Figure 7:
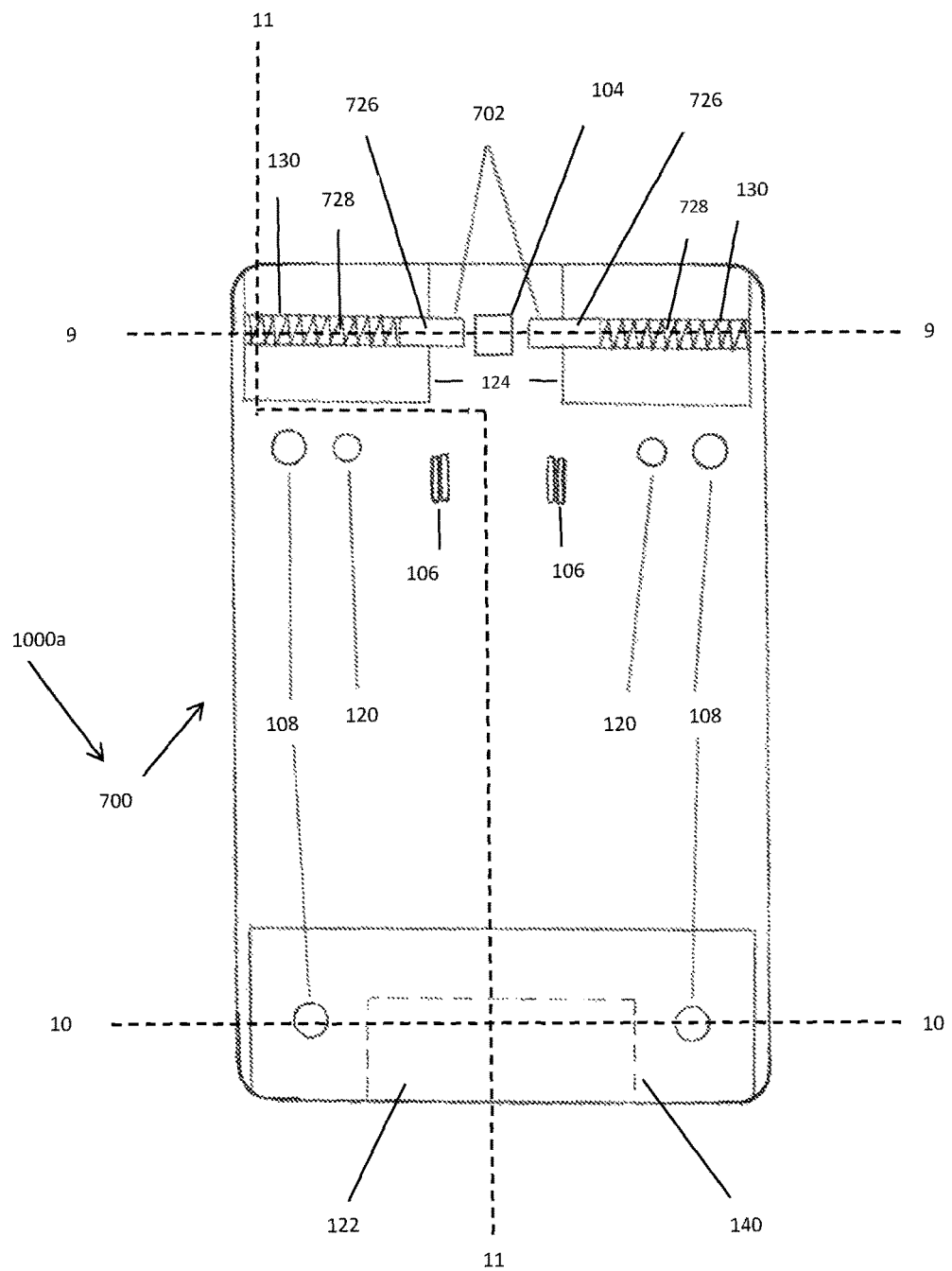
FIG. 7 illustrates a top view of the base of an easy access alarm mount, according to one embodiment disclosed herein.

FIG. 1 illustrates a base 100 of EAAM 1000. The base 100 is configured to be mounted to the ceiling or other mounting surface. The base 100 is secured to the mounting surface by screws or other suitable fixtures inserted through mounting holes 108. The base 100 has a base locking mechanism 102, female electrical connectors 106, mounting holes 108, alignment pin recesses 120, and a hinge mechanism recess 122 disposed at one end of the base 100. The relative location of hinge mechanism recess 122 in the base 100 is shown by the dashed lines 140. An alternative base is illustrated in FIGS. 7, 13, and 15.

As shown in FIG. 1, the base locking mechanism 102 may be two spring loaded ball detent mechanisms disposed on each side of the base 100. A gap 124 is located between the two respective spring loaded ball detent mechanisms 102. An optional magnet 104 is disposed on or within the base 100 within the gap 124. Each spring loaded ball detent mechanism 102 has a spring 128 and a ball 126. Each ball 126 is attached to the spring 128 at one end of the spring 128. The spring 128 biases the ball 126 into an extended position when the cover 200 is not attached to the base 100. The spring 128 and ball 126, as shown in FIG. 1, is disposed in a bore 130 formed in the base 100 and the spring 128 is attached to the base 100 at the end opposite of the ball 126. The spring 128 may be attached to a blind end (e.g., laterally outward end) of the bore 130, or attached to a ball detent access cover 170 which is attached to the base 100 at one end of the bore 130. The ball 126 attached to the spring 128 may be inserted into the base 100 when the ball detent access cover 170 is removed. The bore 130 may be integrally formed within the base 100 by injection molding. The base locking mechanism 102 may alternatively be a modular component attached to the base 100 having the ball 126 and spring 128 disposed in a bore 130 of a locking mechanism housing. The locking mechanism housing is then attached to the base 100 by glue or another suitable attachment means, such as a mechanical fastener.

Figure 2:
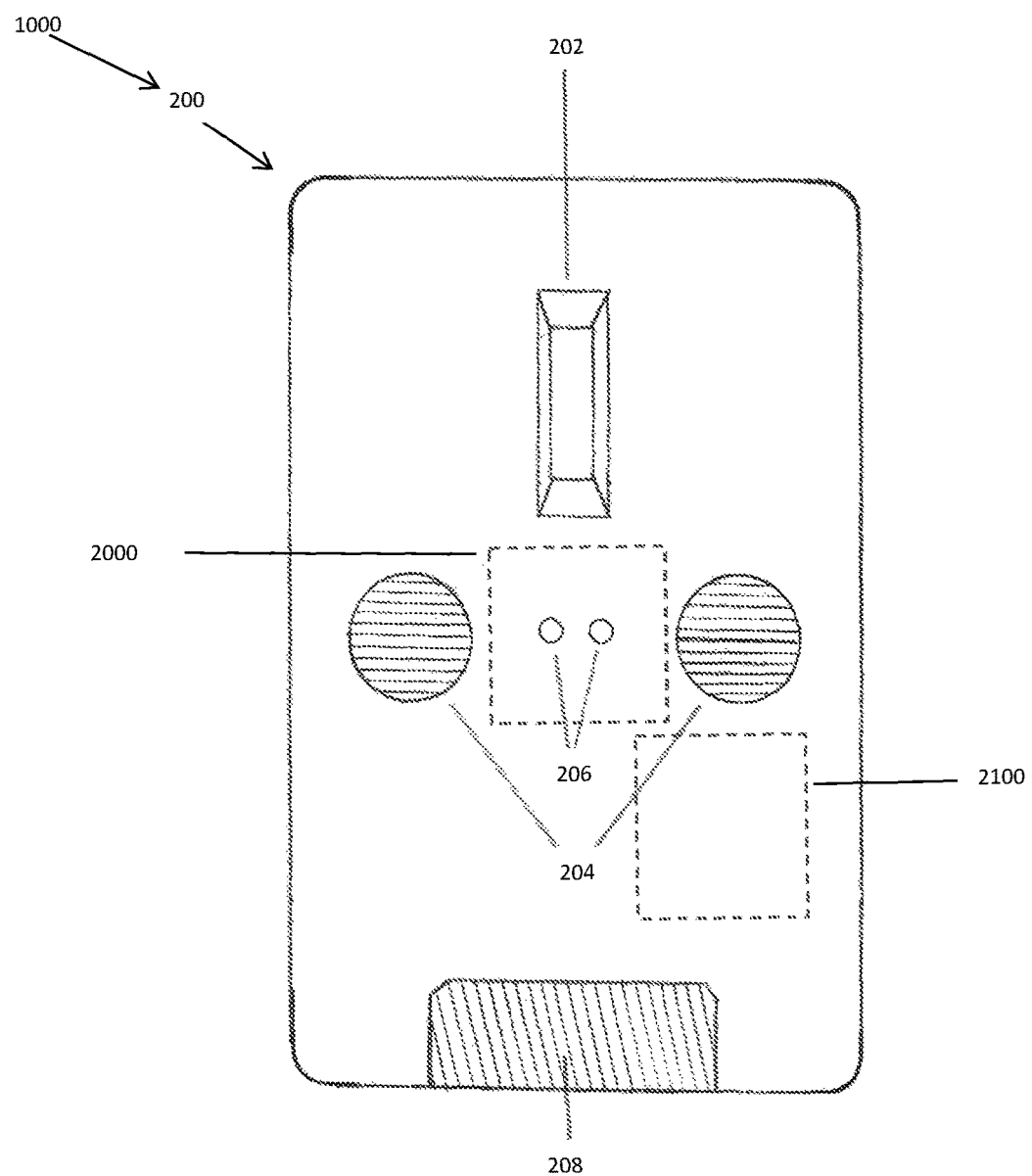
FIG. 2 illustrates a top view of the cover of an easy access alarm mount, according to one embodiment disclosed herein.

FIG. 2 illustrates an outside view of the cover 200. The cover 200 of the EAAM 1000 contains the alarm unit 2000 and the backup battery 2100. The cover 200 has a beveled access wand recess 202, one or more air circulation vents 204, one or more operational light emitting diode (LED's) 206, and a hinge mechanism 250 disposed at one end of the cover 200. The location of the hinge mechanism 250 relative to the top of the cover 200 is shown as 208. The size, location, and shape of the vents 204 and operational LED's 206 may vary. The beveled access wand recess 202 can vary in length and width. The relative location of the alarm unit 2000 and the backup battery 2100 with respect to the outside view of the cover 200 is represented by the dashed lines in FIG. 2. The alarm unit 2000 is preferably placed near the vents 204 to allow the alarm unit 2000 to sense the atmosphere. The alarm unit 2000 and backup battery 2100 are not shown in FIGS. 3-6.

The base 100 and cover 200 are detachably coupled at one end by the insertion of the hinge mechanism 250 into hinge mechanism recess 122. The hinge mechanism 250 is a hinge tab located at one end of the cover 200. The hinge tab 250 extends from one end of the cover 200 and may have a variety of shapes, sizes, and cross sections. The outer surface of the hinge tab 250 may be relatively flat or curved. The hinge mechanism 250 is configured to be inserted into the hinge mechanism recess 122 to detachably couple base 100 to cover 200 at one end of the EAAM 1000.

Figure 6:
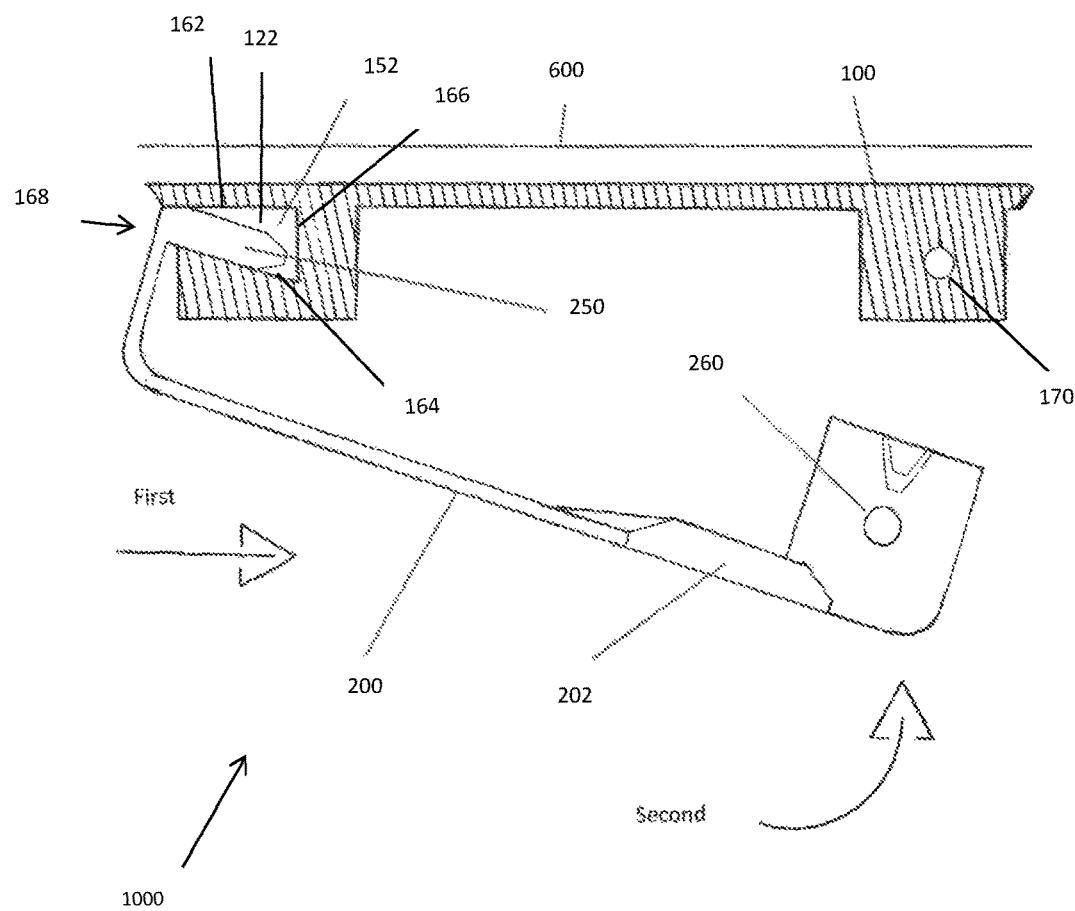
FIG. 6 illustrates a cross-sectional view of the coupling of the cover to the base taken along line 5-5 shown in FIG. 1, according to one embodiment disclosed herein.

Base 100 and cover 200 are further detachably coupled by the engagement of the base locking mechanism 102 of the base 100 with the cover locking mechanism 260 of cover 200. FIG. 1 illustrates a base locking mechanism 102 having two spring loaded ball detent mechanisms disposed on each side of the base 100 corresponding to a cover locking mechanism 260 which is a ball detent locking recess as shown in FIG. 6. A second ball detent locking recess 260 is formed on the other side of the cover 200 corresponding to the other base locking mechanism 102 and is not shown. When the cover 200 is attached to the base 100, as shown in FIG. 6, the ball 126 of the spring loaded ball detent locking mechanism 102 is initially displaced from its extended position when contacted by the surface of cover 200. The ball 126 is biased into engagement with the ball detent locking recess 260 by the spring 128 when each ball detent locking recess 260 aligns with the ball 126 of each spring loaded ball detent locking mechanism 102. The engagement between the base locking mechanism 102 and the cover locking mechanism 260 locks the cover 200 to the base 100. When the cover 200 is detached, the movement of the cover 200 away from the base 100 causes the ball detent locking mechanisms 102 to be displaced from its engagement with the ball detent locking recess 260 to allow the cover 200 to uncouple and thus be unlocked from the base 100.

The base 100 and cover 200 have bayonet style electrical connectors. The base 100 contains the female end of the electrical connectors 106 and the cover 200 has the male end of the connectors (not shown). Using bayonet style electrical connectors allows the cover 200 to be unlocked and removed from the base 100 without disconnecting wires. Female electrical connectors 106 are used in the base 100 to provide a margin of safety to the installer. The female electrical connectors 106 in the base 100 are hard wired to the power source, such as being hard wired into the structures power source. The female electrical connectors 106 have a "live or hot" condition and are recessed into the base 100 to prevent an accidental connection between the contacts. The male connectors with exposed contacts are used in the cover 200 which does not have a power source of its own to minimizing the risk of electrocution since the operator will primarily handle the cover 200 after the base 100 is attached to the mounting surface. The male electrical connections are energized when the cover 200 is locked into place on the base 100 by coming into contact with the female electrical connectors 106, thus providing power to the alarm unit 2000.

Figure 3:
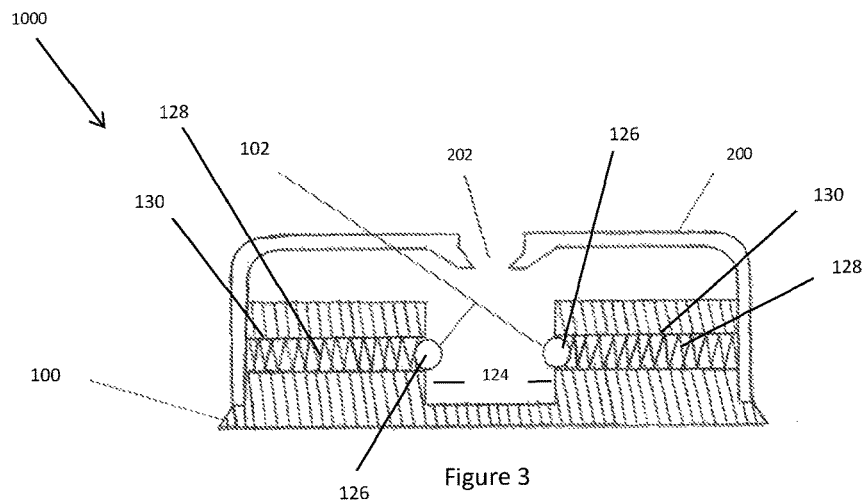
FIG. 3 illustrates a cross-sectional view taken along line 3-3 shown in FIG. 1, according to one embodiment disclosed herein.

FIG. 3 shows a cross-sectional view of the EAAM 1000 along line 3-3 of FIG. 1. FIG. 3 shows the base 100 and cover 200 coupled together except that the portion of cover 200 with the ball detent locking recess 260 is omitted. The cover 200 encases the internal components of the EAAM 1000 when it is coupled to the base 100. As shown in FIG. 3, the beveled access wand recess 202 is at least partially disposed over the gap 124 between the two spring loaded ball detent locking mechanisms 102 as shown in FIG. 3. The cross section of the beveled access wand recess 202 can vary in shape, such as being triangular, rectangular, square, hemispherical, or trapezoidal.

While FIG. 3 illustrates one embodiment of the EAAM 1000, other embodiments are contemplated. For example, while the beveled access wand recess 202 is shown to be at least partially disposed over the gap 124, it is contemplated that the beveled access wand recess 202 is not partially disposed above the gap 124. For example, the beveled access wand recess 202 may be disposed between the gap 124 and the hinge mechanism 250. While FIG. 3 illustrates that the beveled access wand recess 202 is centrally located on the cover 200, it is contemplated that the beveled access wand recess 202 may be offset from the center of the cover 200.

Figure 4:
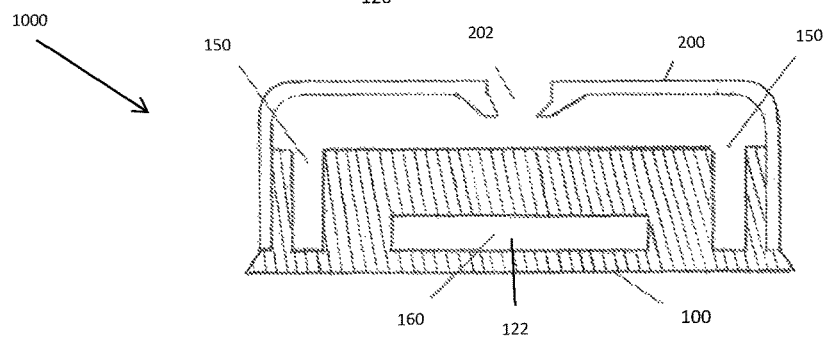
FIG. 4 illustrates a cross-sectional view taken along line 4-4 shown in FIG. 1, according to one embodiment disclosed herein.

FIG. 4 shows a cross-sectional view of the EAAM 1000 along line 4-4 of FIG. 1. As shown in FIG. 4, the beveled access wand recess 202 is at least partially disposed adjacent a portion of the hinge mechanism recess 122, having a cross section 160. FIG. 4 also shows the cross section of the mounting holes 108 as shown by reference sign 150.

While FIG. 4 illustrates one embodiment of the EAAM 1000, other embodiments are contemplated. For example, while the beveled access wand recess 202 is shown as being at least partially disposed adjacent a portion of the hinge mechanism recess 122, it is contemplated that the beveled access wand recess 202 is not disposed adjacent the hinge mechanism recess 122, but instead, is spaced therefrom. For example, the beveled access wand recess 202 may be disposed between the gap 124 and the hinge mechanism recess 122.

Figure 5:
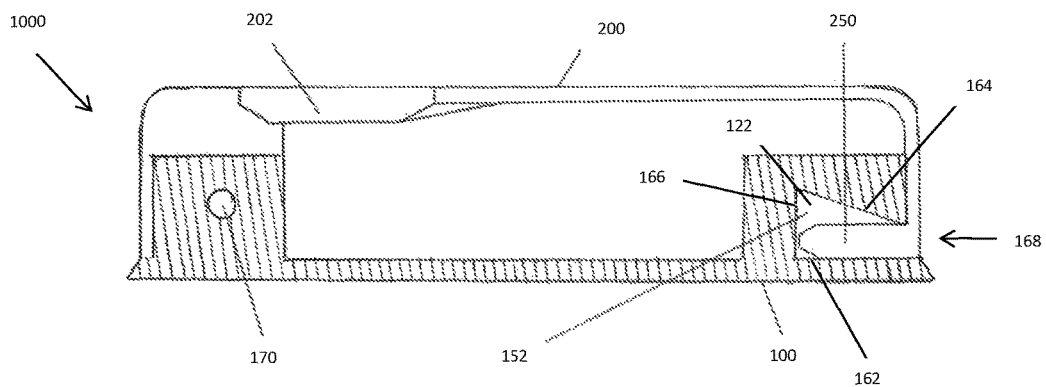
FIG. 5 illustrates a cross-sectional view taken along line 5-5 shown in FIG. 1, according to one embodiment disclosed herein.

FIG. 5 illustrates a cross-sectional view of the base 100 coupled to the cover 200 along line 5-5. FIG. 5 illustrates the cross section 152 of the hinge mechanism recess 122 with respect to the longitudinal axis of the EAAM 1000 extending from one end to the other end. The hinge mechanism 250 is shown to be disposed in the hinge mechanism recess 122. The hinge locking mechanism 122 cross section 152 may have an upper surface 164 that is inclined at an angle relative to the lower surface 162. The incline allows the cover 200 to rotate relative to the base 100 about the hinge mechanism 250 when the hinge mechanism 250 is inserted into the hinge mechanism recess 122. The hinge mechanism recess 122 cross section 152 may come in a variety of shapes and sizes, and the incline of the upper surface 164 may be inclined at a constant or variable slope. Furthermore, the opening 168 of the hinge locking recess 122 may have differing widths and lengths depending on the thickness and length on the hinge mechanism 250. While the hinge mechanism recess 122 shown in FIG. 5 has an opening 168 and a back wall surface 166, the back wall surface 166 may be omitted such that the recess 122 is a partial opening within one end of the base 100 configured to allow the cover 200 to rotate relative to the base 100. The cross section of the hinge mechanism 250 corresponds with the cross section 152 of the hinge mechanism recess 122.

FIG. 6 illustrates a cross-sectional view of base 100 and cover 200 along line 5-5 in the process of being coupled together. Base 100 is mounted to mounting surface 600. The mounting surface 600 may be a ceiling, wall, or other surface of a structure. The base 100 is secured to the mounting surface 600 by screws or other suitable fixtures inserted through the mounting holes 108.

FIGS. 7-12 illustrate an alternative embodiment of the EAAM 1000a. FIG. 7 illustrates an alternative base 700 of the EAAM 1000a. The base 700 has similar components as base 100 illustrated in FIG. 1 which are not repeated for brevity, however, alternative base 700 has a spring loaded pivoting latch locking mechanism 702 instead of a spring loaded ball detent mechanism 102 and the size and placement of the female electrical connectors 106 vary with respect to FIG. 1.

Figure 8:
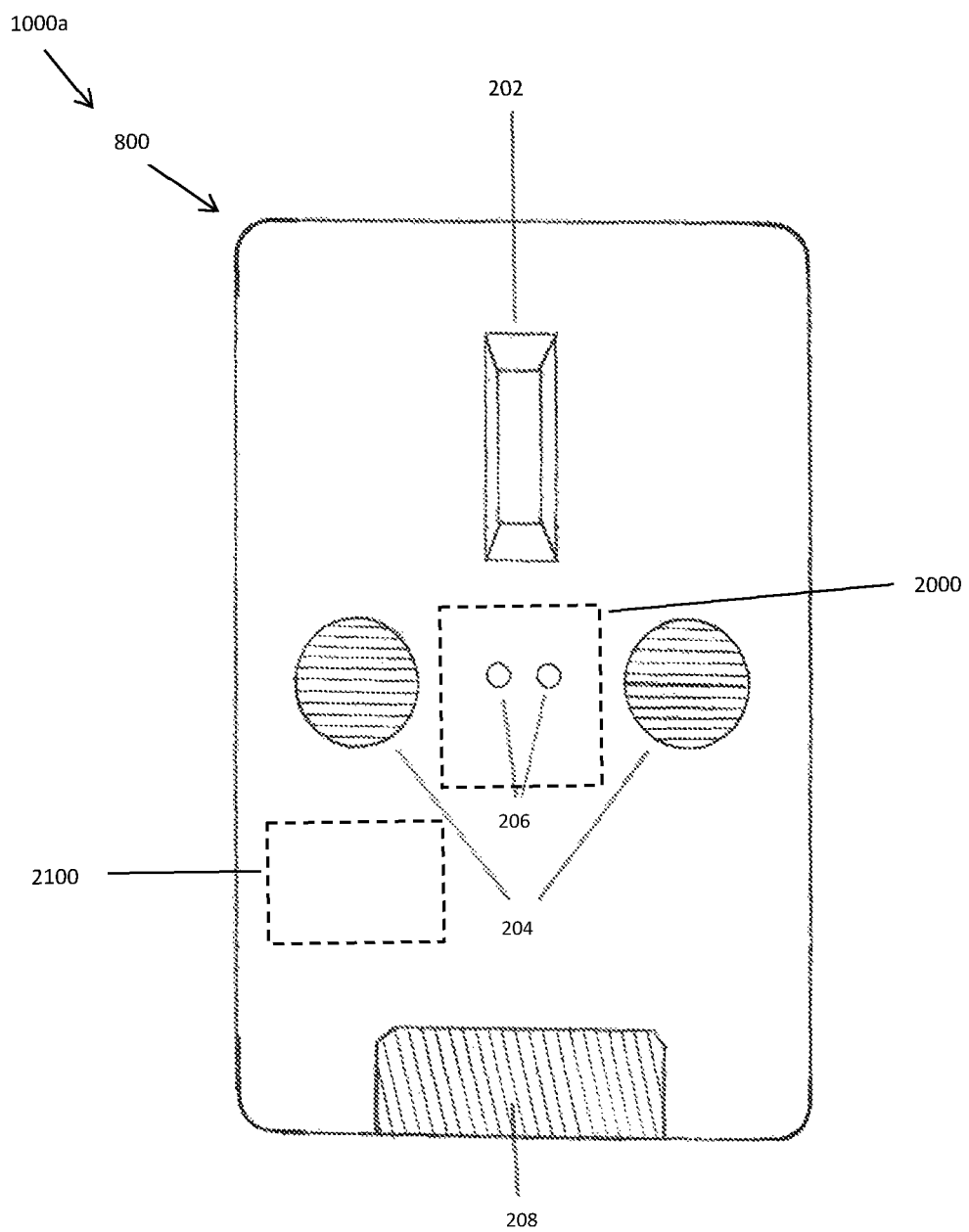
FIG. 8 illustrates a top view of the cover of an easy access alarm mount, according to one embodiment disclosed herein.

FIG. 8 illustrates an alternative cover 800 of the EAAM 1000a. FIG. 8 illustrates an outside view of the cover 800. The cover 800 is similar to FIG. 2. As shown in FIG. 8, the alarm unit 2000 and battery 2100 are shown to be in a different location relative to the outside of the cover 800 with respect to the alarm unit 2000 and battery 2100 shown in FIG. 2. The location of the hinge mechanism 250 relative to the top of the cover is shown as 208. The relative location of the alarm unit 2000 and the backup battery 2100 with respect to the outside view of the cover 800 is represented by the dashed lines in FIG. 8. The alarm unit 2000 and backup battery 2100 are not shown in FIGS. 9-12. The cover locking mechanism 860 is shown in FIG. 12 as a latch locking recess.

Figure 9:
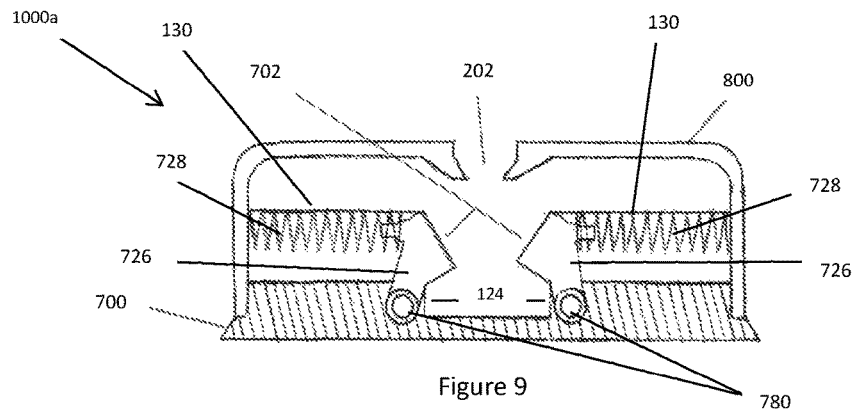
FIG. 9 illustrates a cross-sectional view taken along line 9-9 shown in FIG. 7, according to one embodiment disclosed herein.
Figure 11:
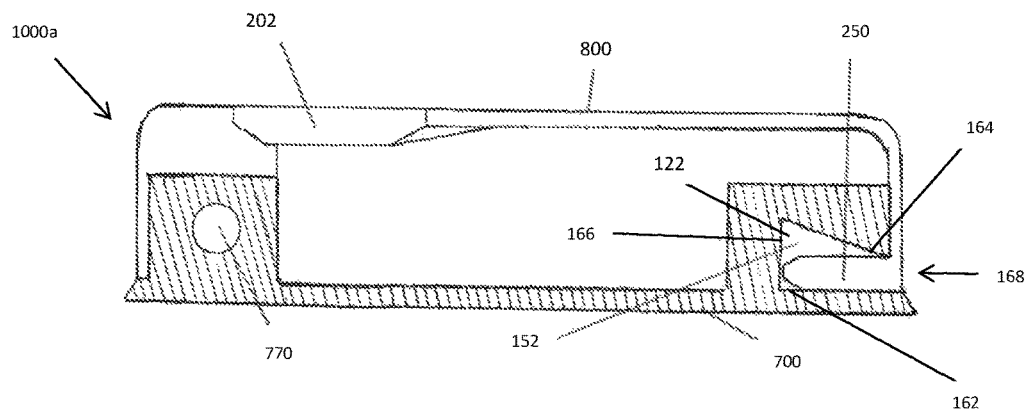
FIG. 11 illustrates a cross-sectional view taken along line 11-11 shown in FIG. 7, according to one embodiment disclosed herein.

FIG. 9 shows a cross-sectional view of alternative base 700 and cover 800 of the EAAM 1000a along line 9-9 of FIG. 7. FIG. 9 shows the base 700 and cover 800 coupled together except that the portion of the cover 800 with the latch locking recess 860 is omitted. FIG. 9 differs from FIG. 3 in that it shows a cross section of alternative cover 800 and base 700 having spring loaded pivoting latch locking mechanism 702. As shown in FIG. 7, the base locking mechanism 702 is two spring loaded pivoting latch locking mechanisms. Each spring loaded pivoting latch locking mechanism 702 has a spring 728 and a latch 726. Each latch 726 is attached to the spring 728 at an upper end. The latch 726 is pivotally coupled to the base 700 by pivotable connection 780. The spring 728 biases the latch 726 in an extended position when the cover 800 is not attached to the base 700. The spring 728 and latch 726 are disposed in a bore 130 in the base 700. The bore 130 may be an open top channel formed in the base 700. The end of the spring 728 opposite of the attachment to the latch 726 may be attached directly to the base 700 or, alternatively, attached to a pivoting latch spring access cover 770 as shown in FIG. 11. Each spring loaded pivoting latch locking mechanism 702 may be a modular unit attached to the base 700 via glue or other suitable fastener.

Figure 12:
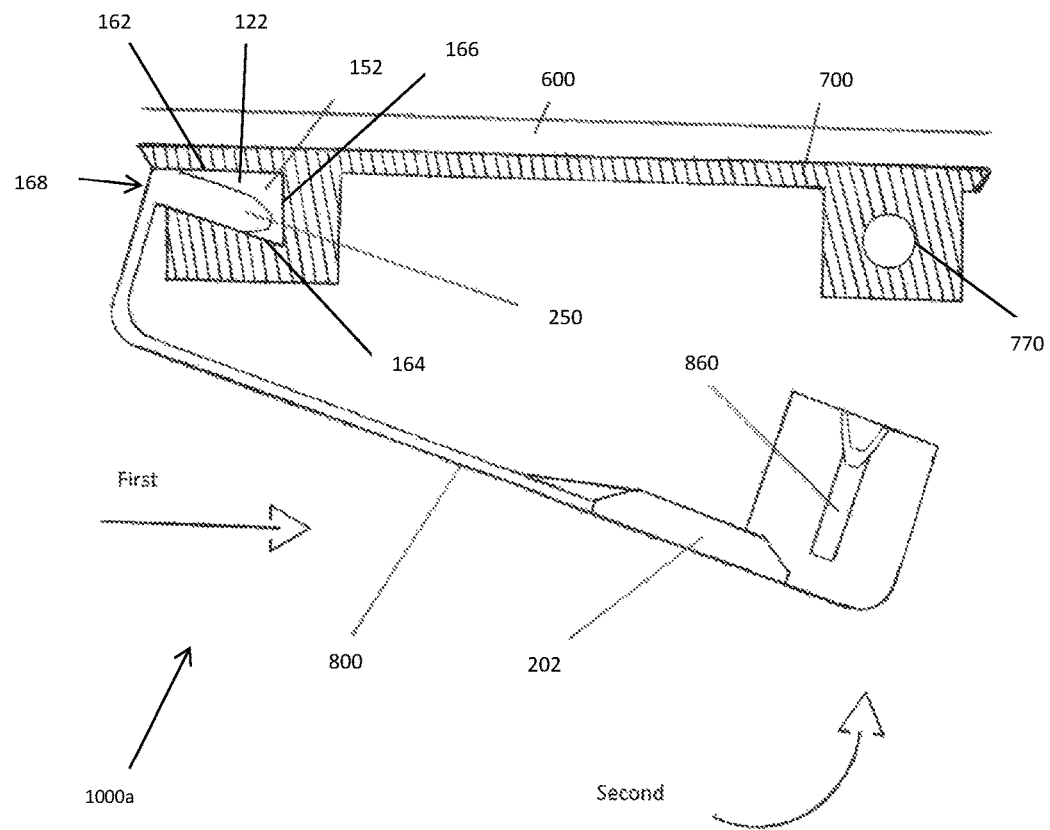
FIG. 12 illustrates a cross-sectional view of the coupling of the cover to the base taken along line 11-11 shown in FIG. 7, according to one embodiment disclosed herein.

The spring loaded pivoting latch locking mechanism 702 correspond to a cover locking mechanism 860 which is a latch locking recess shown in FIG. 12. A second latch locking recess 860 may be formed on the other side of cover 800 corresponding to the other spring loaded pivoting latch locking mechanism 702. The latch locking recess 860 can have a variety of length, widths, and depths and can have a lower inclined portion to guide the latch 726 into the latch locking recess 860 when the cover 800 is being attached to the base 700.

When the cover 800 is attached to the base 700, as shown in FIG. 12, the latch 726 of the spring loaded pivoting latch locking mechanism 702 is initially displaced from its extended position when contacted by the surface of the cover 800. The latch 726 is moved by the spring 728 to engage the latch locking recess 860 when each latch locking recess 860 aligns with the latch 726 of each spring loaded pivoting latch locking mechanism 702. This engagement between the spring loaded pivoting latch locking mechanism 702 and the latch locking recess 860 further detachably couples the cover 800 to the base 700. When the cover 800 is detached, the movement of the cover 800 away from the base 700 causes the latch 726 of each spring loaded pivoting latch locking mechanism 702 to be displaced from its engagement with the latch locking recess 860 to allow the cover 800 to uncouple from the base 700, and thereby unlocking the cover 800 from the base 700.

Figure 10:
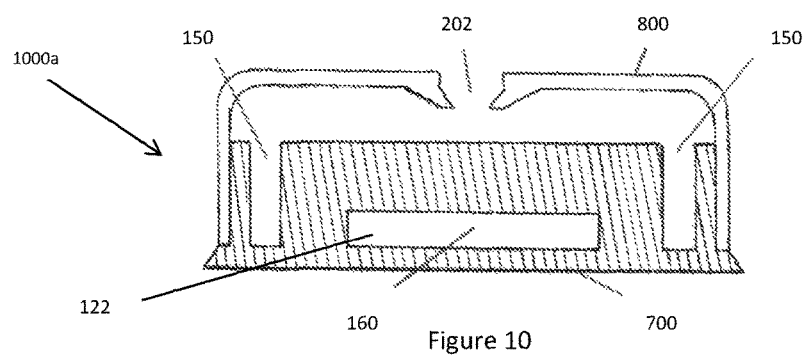
FIG. 10 illustrates a cross-sectional view taken along line 10-10 shown in FIG. 7, according to one embodiment disclosed herein.

FIG. 10 shows a cross-sectional view of the EAAM 1000a along line 10-10 of FIG. 7. FIG. 10 differs from FIG. 4 in that it illustrates alternative cover 800 and alternative base 700 when coupled together.

FIG. 11 illustrates a cross-sectional view of alternative base 700 coupled to alternative cover 800 along line 11-11. FIG. 11 illustrates a cross section 152 of the hinge mechanism recess 122 with respect to the longitudinal axis of the EAAM 1000a extending from one end to the other end. As shown, the cross section of alternative cover 800 and base 700 shown in FIG. 11 is substantially the same as the cross section shown in FIG. 5, however, pivoting latch spring access cover 770 is illustrated in FIG. 11 in place of ball detent access cover 170 illustrated in FIG. 5.

FIGS. 13-14 illustrate an alternative embodiment of the EAAM 1000b. Base 1300 has components similar to the base 100 illustrated in FIGS. 1 and 7. Cover 1400 has components similar to cover 200 illustrated in FIGS. 2 and 8. The similar components are not repeated for brevity. This embodiment is different than the embodiment illustrated in FIGS. 1-6 and 7-12 in that cover 1400 has a twin hinge mechanism design in place of the larger single hinge mechanism design. Cover 1400 has a hinge mechanism 1450 having two hinge tabs 250. The hinge mechanism 1450 is similar to the hinge tab 250 of the previous embodiments. The location of the hinge mechanism 1450 having two hinge tabs 250 relative to the top of the cover 1400 is shown by reference sign 1408. The hinge mechanism 1450, having the two hinge tabs 250, is configured to be inserted into the hinge mechanism recess 1322 of base 1300 having two individual recesses. The location of the hinge mechanism recess 1322 relative to the top view of the base 1300 in FIG. 13 is shown by the dashed lines 1340. The base 1300 and cover 1400 are coupled by the insertion of hinge mechanism 1450 into the hinge mechanism recess 1322 and the engagement of base locking mechanism 102 with the cover locking mechanism 260 (not shown). As shown in FIG. 13, the hinge mechanism recess 1322 is two individual recesses. However, alternative embodiments of the EAAM 1000b are contemplated. For example, the hinge mechanism 1450 may have more than two hinge tabs corresponding to a hinge mechanism recess 122 having two or more individual recesses.

FIG. 13 illustrates alternative base 1300 of the EAAM 1000b. Base 1300 has similar components to the base 100 illustrated in FIGS. 1 and 7 and are not repeated for brevity. As shown in FIG. 13, the hinge mechanism recess 1322 is two recesses. Each hinge mechanism recess of 1322 is similar to hinge mechanism recess 122. Each hinge mechanism recess 1322 has an opening 168 of with a width and length depending on the width and length of the individual corresponding hinge tab 250. Each hinge mechanism recess 1322 may have a cross section similar to the hinge locking recess 122 in FIGS. 4 and 10, shown as reference sign 160. The two recesses of the hinge mechanism recess 122 may have similar cross section 152 of the hinge mechanism recess 122 shown in FIGS. 5 and 11. The interaction of hinge mechanism 1450 and hinge mechanism recess 1322 allows the cover 1400 to rotate relative to the base 1300 when the cover 1400 is attached or detached from the base 1300.

As shown in FIG. 13, the base locking mechanism 102 may be two spring loaded ball detent mechanisms disposed on each side of the base 1300 similar to the embodiment described in FIGS. 1-6 that corresponds to a ball detent locking recess 260. However, the base locking mechanism may be a spring loaded pivoting latch locking mechanism 702 similar to base locking mechanism 702 of FIG. 7-12. The cover locking mechanism may be similar to the cover locking mechanism 860, the latch locking recess, as shown in FIG. 12. The cover locking mechanism may be a ball detent locking recess 260 or a latch locking recess 860 depending on which base locking mechanism 102, 702 is incorporated into the base 1300.

FIGS. 15 and 16 illustrate an alternative embodiment of the EAAM 1000c. The cover 1600 and base 1500 have similar components to the base 100 and cover 200 illustrated in FIGS. 1, 2, 7, and 8. The components are not repeated for brevity. This alternative EAAM 1000c differs from the previous embodiments in that the cover 1600 is attached to base 1500 by the engagement of the base locking mechanism 1502 with the cover locking mechanism (not shown) instead of the hinge style EAAM, such as EAAM 1000, 1000a, or 1000b, having a hinge mechanism and a hinge mechanism recess.

Base 1500 has a base locking mechanism 1502. The base locking mechanism 1502 may be the spring loaded ball detent mechanism 102 or the spring loaded pivoting latch mechanism 702 similar to the base locking mechanism 102 of FIG. 1 and 702 of FIG. 7. The base 1500 and cover 1600 can be coupled or uncoupled by the engagement or disengagement of base locking mechanism 1502 and the cover locking mechanism (not shown). The cover locking mechanism may be similar to the cover locking mechanism 260 and 860. As shown in FIG. 15, the base 1500 has a base locking mechanism 1502 having four spring ball detent mechanisms corresponding to four ball detent locking recesses 260 of the cover 1600 (not shown). The cover alignment pins (not shown) correspond with the base alignment pin recesses 120 to ensure proper alignment when the cover 1600 is attached to the base 1500. However, alternative embodiments of the direct attachment EAAM 1000c are contemplated. Embodiments of the direct attachment embodiment may have a base locking mechanism 1502 having one or more spring loaded ball detent mechanisms 102 corresponding to one or more ball detent locking recesses 260 on the cover 1500. Embodiments of the direct attachment EAAM 1000c may have a base locking mechanism 1502 having one or more spring loaded pivoting latch locking mechanism 702 corresponding to one or more latch locking recesses 860 on the cover 1500. Embodiments of the direct attachment EAAM 1000c may have a base locking mechanism 1502 having a combination of one or more spring loaded pivoting latch locking mechanisms 702 and one or more spring loaded ball detent mechanisms 102 corresponding to a combination of respective cover locking mechanisms 260, 860.

Figure 17:
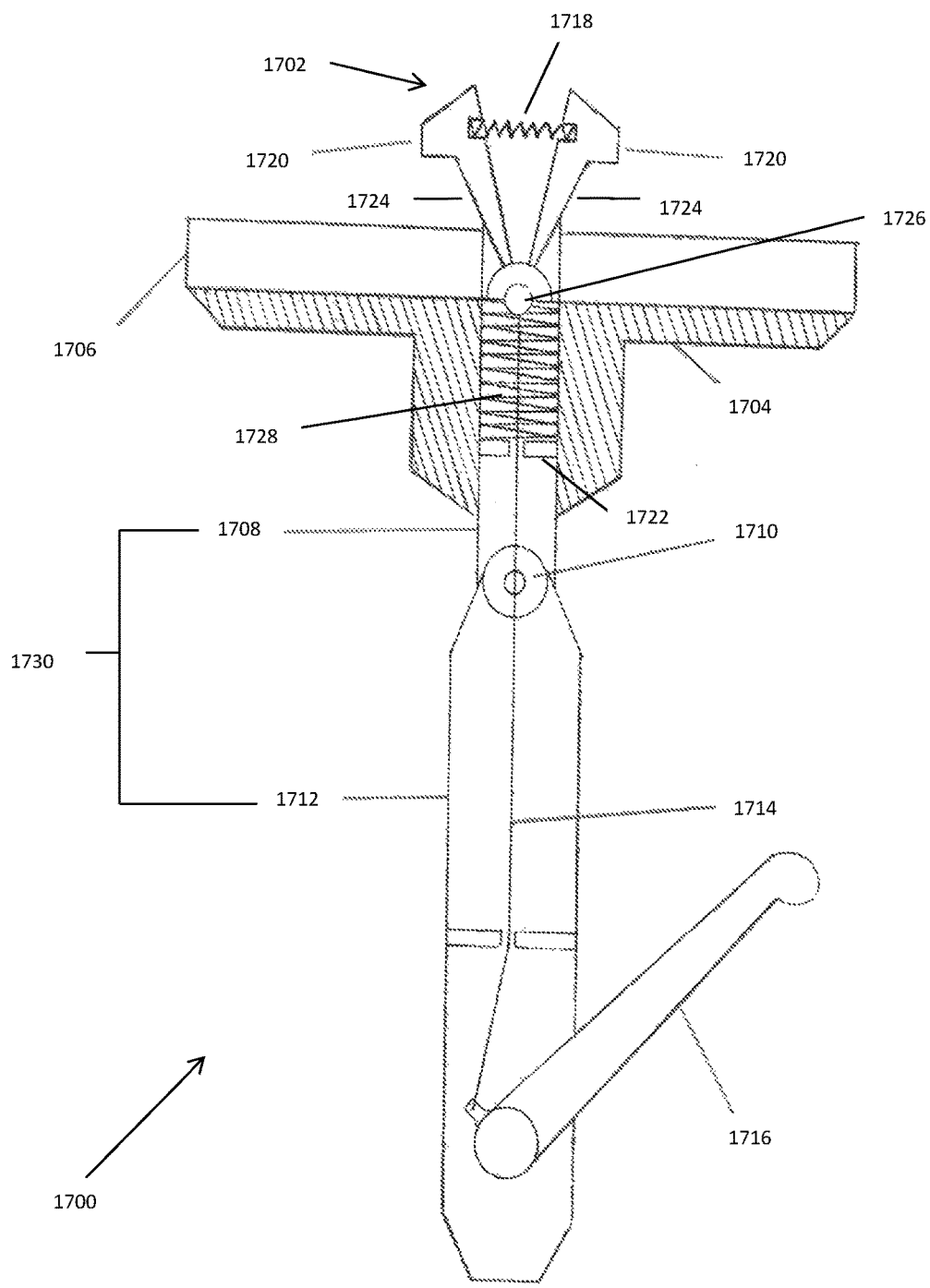
FIG. 17 illustrates an access wand, according to one embodiment disclosed herein.

FIG. 17 illustrates an access wand 1700 that can be used to attach or detach the EAAM's cover from its base. Reference sign 1800 represents any cover described above or described below of EAAM 1000, 1000a, 1000b, or 1000c. The access wand 1700 can be used with any of the EAAM embodiments previously and hereinafter described.

As shown in FIG. 17, the access wand 1700 has a cover engagement mechanism 1702, a pivoting head 1708 having a support brace 1704 with a support brace pad 1706, a tubular handle body 1712, a pivoting joint 1710 between the pivoting head 1708 and the handle body 1712, an actuating cable 1714, and a lever 1716. The support brace pad 1706 is preferably made from a soft material to protect the cover 1800 and cushion the cover from unintended forces exerted by the operator. However, the support brace pad 1706 may be omitted.

The access wand 1700 is configured to attach and detach cover 1800 at the beveled access wand recess 202. The access wand 1700 attaches to the beveled access wand recess 202 by the engagement of the cover engagement mechanism 1702.

Figure 18:
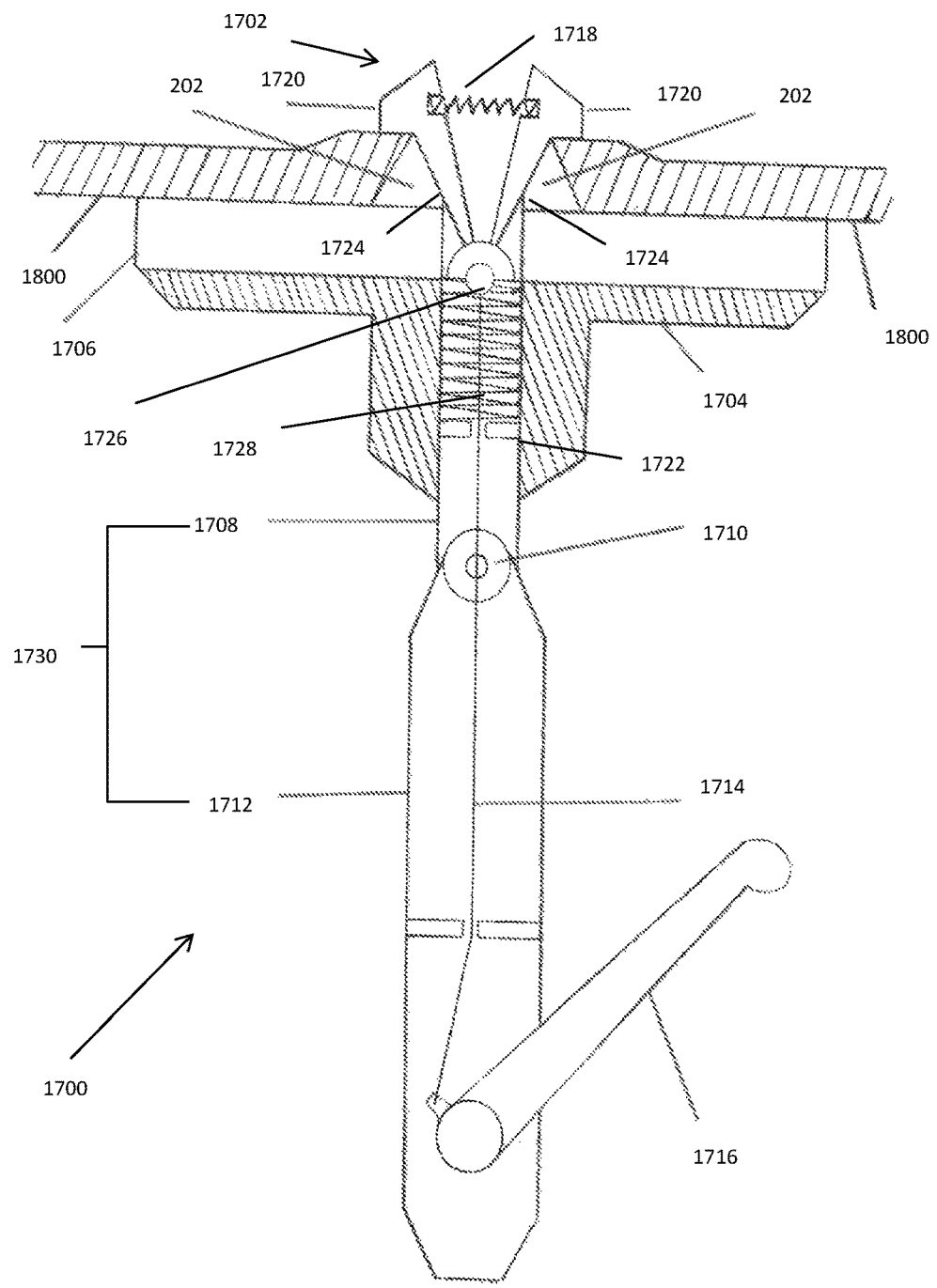
FIG. 18 illustrates an access wand engaged with an easy access alarm mount cover, according to one embodiment disclosed herein.

The cover engagement mechanism 1702 has two latches 1720 with a spring 1718 therebetween. The cover engagement mechanism 1702 is located at the upper portion of the access wand 1700. The spring 1718 biases the two latches 1720 in an extended position. The extended position is shown in FIG. 18. The two latches 1720 are pivotally coupled to one another at 1726. The cover engagement mechanism 1702 also includes an actuation spring 1728 disposed in the handle body 1712. The actuation spring 1728 is attached to the latches 1720 at one end. The attachment of the actuation spring 1728 to the latches 1720 may be at the pivotal connection 1726 between the two latches. The actuation spring 1728 may be attached to the handle body 1712 at the other end. For example, the actuation spring 1728 may be attached at a shoulder 1722 formed within a bore of the handle body 1712.

An actuation cable 1714 is disposed in the handle body 1712 and pivoting head 1708. Pivoting head 1708 and handle body 1712 form the tubular body 1730 of the access wand 1700. The actuation cable 1714 is attached at one end to the lever 1716. The actuation cable 1714 is attached at the other end to the cover engagement mechanism 1702. The attachment of the actuation cable 1714 with the cover engagement mechanism 1702 is illustrated at the pivotal connection 1726 of the two latches 1720.

When the lever 1716 is at a first position, the actuation cable 1714 is not transmitting force from the lever 1716 to the cover engagement mechanism 1702. When the lever 1716 is at a second position, such as being pulled up or squeezed by the operator's hand relative to the handle body 1712, the actuation cable 1714 is tensioned resulting in the actuation cable 1714 causing the two latches 1720 to move from the extended position to an unextended position. When the lever 1716 is returned to the first position, the spring 1718 biases the two latches 1720 back into the extended position. The lever 1716 can be moved by the operator's fingers and is disposed at a lower portion of the handle body 1712. The operator may grip the lower portion of the handle body 1712 when using the access wand 1700.

When the lever 1716 is moved from the first to the second position, the actuation cable 1714 pulls the cover engagement mechanism 1702 downward. The two latches 1720 are moved from the extended to the unextended position as a result of the contact of the outer surface 1724 of the latches 1720 with the outer surface of the support brace 1704 having a support brace pad 1706 as the two latches 1720 are retracted into the handle body 1712. The outer surface 1724 of the two latches 1720 may have an incline to facilitate the movement of the two latches 1720 from the extended to the unextended position along the contact surface. The movement of the two latches 1720 from the extended to the unextended position can be partially facilitated by the outer surface of the cover 1800, such as the surface of the beveled access wand recess 202, when the latches 1720 are inserted into the cover 1800.

When the lever 1716 is moved from the second position to the first position, the actuation spring 1728 moves the two latches 1720 upward relative to the handle body 1712. As the latches 1720 move upward, the spring 1718 biases them apart. When the actuation spring 1728 reaches its full extension, the latches 1720 are free to be fully extended by the spring 1718.

The access wand 1700 engages the cover 1800 via the beveled access wand recess 202. In order to engage the cover 1800, the latches 1720 must be substantially in the unextended position in order to accommodate the width of the beveled access wand recess 202. Once the latches 1720 are in the substantially unextended position by moving the lever 1716 toward the second position, the two latches 1720 are inserted into the beveled access wand recess 202. The outer surface of the beveled access wand recess 202 may also facilitate the insertion of the latches 1720 into the recess when the beveled edges of the beveled access wand recess 202 engage with the beveled edges on the upper portion of the latches 1720 to further move the latches 1720 to the unextended position. Then, the lever 1716 is moved back to the first position allowing the latches 1720 to return to the extended position. While the latches 1720 are in the extended position, the access wand 1700 is in engagement with, and thus attached to, the cover 1800 as shown in FIG. 18. As shown in FIG. 18, a lower edge of the latches 1720 prevents the latches 1720 from being withdrawn from the beveled access wand recess 202 while in the extended position. The engagement of the access wand 1700 to the cover 1800 is steadied by the engagement of the support brace 1704 having a support brace pad 1706 with the outer surface of the cover 1800.

The access wand 1700 can be disengaged from the cover 1800. In order to disengage the access wand 1700 from the cover 1800, the lever 1716 is moved to the second position to move the latches 1720 to the unextended position. Once in the unextended position, the latches 1720 can be removed from the beveled access wand recess 202. As a result, the access wand is disengaged with the cover 1800.

The pivoting head 1708 may pivot relative to the handle body 1712 to allow the operator to engage the beveled access wand recess 202 when the EAAM's is in difficult to reach locations. Pivoting the pivoting head 1708 relative to the handle body 1712 allows the access wand 1700 to achieve the correct position for the latches 1720 and the support brace 1704 with a support brace pad 1706 to align with the beveled access wand recess 202 and cover 1800 to allow for proper engagement.

An alternative method of attaching the access wand 1700 to the cover 1800 is contemplated. In this embodiment, the latches 1720 engage the beveled access wand recess 202 of cover 1800 without moving the lever 1716 from the first to the second position. The operator moves the cover engagement mechanism 1702 into proximity of the beveled access wand recess 202. Then, the latches 1720 of the cover engagement mechanism 1702 are inserted into the beveled access wand recess 202. As the latches 1720 are inserted into the beveled access wand recess 202, the beveled edges located at an upper portion of the latches 1720 engage with the outer surface of the beveled access wand recess 202. As shown in FIG. 18, the outer surface of the beveled access wand recess 202 are beveled. The engagement of the beveled access wand recess 202 outer surface with the beveled edges of the latches 1720 during the insertion of the insertion of the latches 1720 into the beveled access wand recess 202 causes the latches 1720 to move from the extended to the unextended position. The spring 1718 is compressed. Once the latches 1720 are fully inserted into the beveled access wand recess 202, the spring 1718 biases the latches 1720 into the extended position to attach the cover 1800 to the access wand 1700. As shown in FIG. 18, a lower edge of the latches 1720 prevents the latches 1720 from being withdrawn from the beveled access wand recess 202 while in the extended position. This alternative method of attaching the access wand 1700 to the cover 1800 is disengaged from the beveled access wand recess 202 as described above. The lever 1716 is moved to the second position to move the latches 1720 from the extended to the unextended position.

The access wand 1700 may have a fixed length from one to 8 feet. The access wand 1700 may have an adjustable length from one foot to thirty feet, with the handle body 1712 having a folding or telescoping design.

FIG. 6 illustrates connecting EAAM 1000 cover 200 to base 100 that is mounted on a mounting surface 600. The cover 200 may be coupled to the base 100 or detached from the base 100 by hand or by an access wand 1700.

To install the cover 200 onto the base 100 by hand, the hinge mechanism 250, such as the hinge tab, is inserted into the hinge mechanism recess 122 via opening 168. This insertion may be accomplished with a slight hooking motion. Then, the opposite end of the cover 200 with respect to the hinge mechanism recess 122 is rotated relative to the base 100 until the cover locking mechanism 260 is engaged by the base locking mechanism 102 to couple the cover 200 to the base 100, thereby locking the base 100 and cover 200 into place. The rotation of the cover 200 relative to the base 100 is allowed by the freedom of the hinge mechanism 250 to move within the hinge mechanism recess 122. The hinge mechanism 250 is able to pivot within the hinge mechanism recess 122. As the cover 200 is rotated into place, the alignment pins mounted in the cover 200 (not shown) engage the alignment pin recesses 120 in the base 100 to ensure proper alignment of the cover 200 with the base 100. The bayonet style male electrical connectors (not shown) mounted in the cover 200 also engage the female electrical connectors 106 in the base 100 as the cover 200 is rotated into place. Electricity is supplied to the alarm unit 2000 across the male and female connectors when the cover 200 is locked into place.

To detach the cover 200 from the base 100 by hand, the order of installation is reversed. The cover 200 is removed by pulling the cover 200 away from the base 100 with the operator's hand near the location of the engagement between the base locking mechanism 102 and the cover locking mechanism 260. This location can be finger recesses formed on either side of the cover, which are not shown. Pulling the cover 200 at this location results in the respective base and cover locking mechanisms 102, 260 and male and female 106 electrical connectors disengaging from one another. The cover 200 is then rotated relative to the base 100 until the end of the cover 200 having the cover locking mechanism 260 is clear of the base 100. This rotation is allowed by the freedom of the hinge mechanism 250 to move within the hinge mechanism recess 122. Then the cover 200 is moved away from the base 100, and thus away from the hinge mechanism recess 122, to remove the hinge mechanism 250 from the hinge mechanism recess 122. Thus, the cover 200 is detachable from the base 100. An operator can then replace the battery, such as a backup battery 2100, therein.

In order to attach or detach the cover 200 to the base 100 with the access wand 1700, the access wand 1700 is first engages the cover 200. The engagement of the access wand 1700 to the cover 200 is steadied by the engagement of the support brace 1704 having a support brace pad 1706 with the outer surface of the cover 200.

The cover 200 can be installed on the base 100 by the access wand 1700 after the access wand 1700 is engaged to the cover 200. The cover 200 is attached to the end of the access wand 1700 opposite the operator. To install the cover 200 onto the base 100 with the access wand 1700, the hinge mechanism 250, such as the hinge tab, is inserted into the hinge mechanism recess 122 via opening 168. This insertion may be accomplished with a slight hooking motion. Then, the opposite end of the cover 200 with respect to the hinge mechanism recess 122 is rotated relative to the base 100 until the cover locking mechanism 260 is engaged by the base locking mechanism 102 to couple the cover 200 to the base 100, thereby locking the base 100 and cover 200 into place. The rotation of the cover 200 relative to the base 100 is allowed by the freedom of the hinge mechanism 250 to move within the hinge mechanism recess 122. As the cover 200 is rotated into place, the alignment pins mounted in the cover 200 (not shown) engage the alignment pin recesses 120 in the base 100 to ensure proper alignment of the cover 200 with the base 100. The bayonet style male electrical connectors (not shown) mounted in the cover 200 also engage the female electrical connectors 106 in the base 100 as the cover 200 is rotated into place. Electricity is supplied to the alarm unit 2000 across the male and female 106 connectors when the cover 200 is locked into place. The access wand 1700 is disengaged from the cover 200 after the cover 200 is coupled to the base 100. In order to disengage the access wand 1700, the lever 1716 is moved to the second position to move the latches 1720 to the unextended position. Once in the unextended position, the latches 1720 may be removed from the beveled access wand recess 202.

To detach the cover 200 from the base 100 with the access wand 1700, the access wand 1700 is first engaged to the cover 200. The cover 200 is removed by pulling the cover 200 away from the base 100 with the access wand 1700, resulting in the respective base locking mechanism 102 and cover locking mechanism 260, and male and female electrical connectors 106 to disengage from one another. The cover 200 is then rotated relative to the base 100 until the end of the cover 200 having the cover locking mechanism 260 is clear of the base 100. This rotation is allowed by the freedom of the hinge mechanism 250 to move within the hinge mechanism recess 122. The hinge mechanism 250 is able to pivot within the hinge mechanism recess 122. Then the cover 200 is moved away from the base 100, and thus away from the hinge mechanism recess 122, to remove the hinge mechanism 250 from the hinge mechanism recess 122. Thus, the cover 200 is detachable from the base 100. An operator can then replace the battery, such as a backup battery 2100, therein. The access wand 1700 may be detached from the cover 200 during the pendency of the backup battery 2100 change.

FIG. 12 illustrates connecting cover 800 to base 700 of the EAAM 1000a. The cover 800 of EAAM 1000a is attached and detached from the base 700, by hand or with access wand 1700, in substantially the same way as cover 200 and base 100 of EAAM 1000. The difference is that EAAM 1000a has base locking mechanism 702 and cover locking mechanism 860.

Some embodiments of the EAAM have a cover with a hinge mechanism with more than one hinge tab 250 and a base having a hinge mechanism recess with more than one individual recess. FIGS. 13 and 14 illustrate one embodiment of the EAAM 1000b with a two hinge tabs 250 and two individual hinge mechanism recess 1322 design. The cover 1400 and base 1300 of the multiple hinge tab 250 and hinge mechanism recess 1322 are attached and detached from one another in the same manner as the hinge mechanism 250 having one hinge tab corresponding to the hinge mechanism recess 122 with one recess embodiments of the EAAM 1000 and 1000a as shown in FIGS. 6 and 12. The more than one hinge tab 250 is inserted into the one or more individual hinge mechanism recesses 1322 via opening 168. Then, the base locking mechanism 102 and the cover locking mechanism 260 are engaged to lock the cover 1400 to the base 1300.

FIGS. 15 and 16 illustrate an alternative embodiment of the EAAM 1000c having a cover 1600 that is directly attached to base 1500 without a hinge mechanism 250 or a hinge mechanism recess 122. Cover 1600 may be installed onto base 1500 by use of access wand 1700 or by hand. The base 1500 may already be mounted onto the mounting surface 600.

To install cover 1600 onto base 1500 by hand, an operator places the bottom side of cover 1600 near the base 1500 and moves the cover 1600 to substantially align the cover 1600 with the base 1500. Then, the operator moves the cover 1600 towards the base 1500. The cover alignment pins (not shown) correspond to base alignment pin recesses 120 to guide the cover 1600 onto the base 1500 to ensure proper alignment of the components. Once the cover alignment pins are substantially aligned with the base alignment pin recesses 120, the continued movement of the cover 1600 toward the base 1500 causes the base locking mechanism 1502 to engage with the cover locking mechanism (not shown) to lock the cover 1600 into place. As shown in FIG. 15, the base locking mechanism 1502 is four spring loaded ball detent mechanisms. However, the process will be the same regardless of the type, number, or combination of components that form base locking mechanism 1502. Similarly, the process will be the same regardless of the type, number, or combination of corresponding components that form the cover locking mechanism, such as the ball detent locking recess 260 and the latch locking recess 860. The male electrical connectors (not shown) in the cover come into contact with the female electrical connectors 106 as the cover 1600 and base 1500 are locked into place. The connection between female 106 and male electrical connectors allows the alarm unit 2000 to receive power.

To remove the cover 1600 from the base 1500 by hand, the order of installation is reversed. The cover 1600 is removed by pulling the cover 1600 away from the base 1500 with the operator's hand. The cover 1600 may or may not have finger recesses. Pulling the cover 1600 causes the respective base 1502 and cover (not shown) locking mechanisms and male and female 106 electrical connectors to disengage from one another. The cover 1600 is moved away from the base 1500 until it is clear from the base 1500. Then the operator can replace the backup battery 2100.

In order to attach or detach the cover 1600 to the base 1500 with the access wand 1700, the access wand 1700 is first engaged to the cover 1600. The engagement of the access wand 1700 to the cover 1600 is steadied by the engagement of the support brace 1704 having a support brace pad 1706 with the outer surface of the cover 1600.

The cover 1600 will be attached at one end of the access wand 1700 opposite the operator. The operator first places the bottom side of the cover 1600 near the base 1500 and then moves the cover 1600 to substantially align the cover 1600 with the base 1500. Then, the operator moves the cover 1600 towards the base 1500. The cover alignment pins (not shown) correspond to base alignment pin recesses 120 to guide the cover 1600 onto the base 1500 to ensure proper alignment of the components. Once the cover alignment pins are substantially aligned with the base alignment pin recesses 120, the continued movement of the cover 1600 toward the base 1500 causes the base locking mechanism 1502 to engage with the cover locking mechanism (not shown) to lock the cover 1600 into place. As shown in FIG. 15, the base locking mechanism 1502 is four spring loaded ball detent mechanism. However, the process will be the same regardless of the type, number, or combination of components that form base locking mechanism 1502. Similarly, the process will be the same regardless of the type, number, or combination of corresponding components that form the cover locking mechanism. The male electrical connectors (not shown) in the cover come into contact with the female electrical connectors 106 as the cover 1600 and base 1500 are locked into place. The connection between female 106 and male electrical connectors allows the alarm unit 2000 to receive power. The access wand 1700 is disengaged from the cover 1600 after the cover 1600 is coupled to the base 1500. In order to disengage the access wand 1700, the lever 1716 is moved to the second position to move the latches 1720 to the unextended position. Once in the unextended position, the latches 1720 are be removed from the beveled access wand recess 202.

To remove the cover 1600 from the base 1500 with access wand 1700, the wand 1700 is first engaged to the cover 1600. The cover 1600 is removed by pulling the cover 1600 away from the base 1500 with the access wand 1700. Pulling the cover 1600 away from the base 1500 causes the respective base 1502 and cover (not shown) locking mechanisms and male and female 106 electrical connectors to disengage from one another. The cover 1600 is moved away from the base 1500 until it is clear from the base 1500. Then the operator can replace the battery, such as backup battery 2100. The access wand 1700 may be detached from the cover 1600 during the pendency of the backup battery 2100 change.

Figure 19:
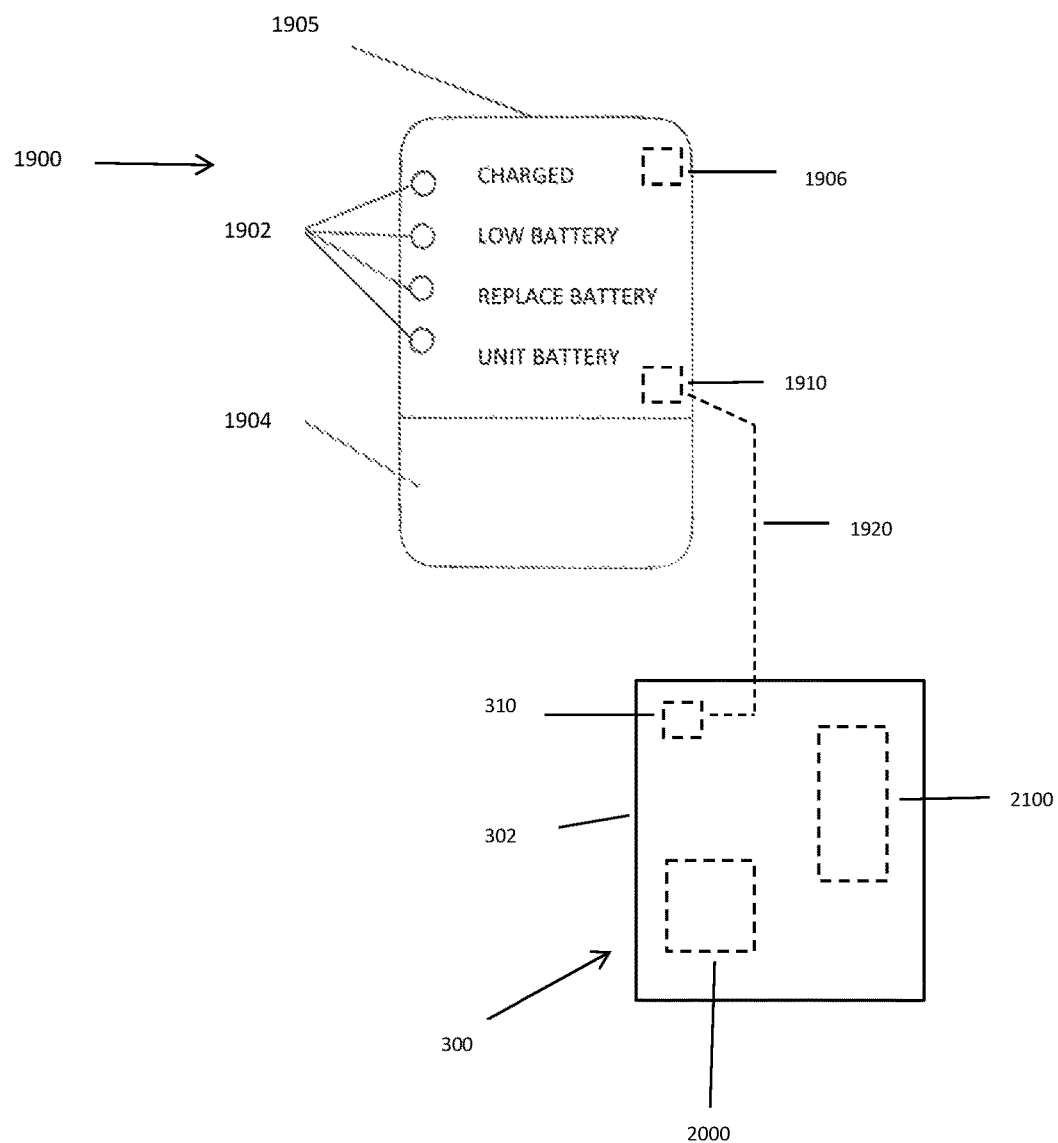
FIG. 19 is a notification module and an alarm system, according to one embodiment disclosed herein.

FIG. 19 shows a mounted notification module 1900. The notification module 1900 may be mounted on a mounting surface, such as mounting surface 600. The notification module includes a housing 1905 having a cover and base. The notification module 1900 may have a battery for its own power needs or it may be hard wired into the structures electrical system. A microprocessor 1906 is disposed within the housing 1905 and receives electricity from either the battery or the structures' electrical supply. The relative location of the microprocessor 1906 with respect to the top view of the notification module 1900 as illustrated in FIG.

19. The notification module 1900 is in communication with an alarm system 300. Alarm system 300 may be any of the EAAM embodiments described above or below, or may be any existing types of alarms or detectors that use a battery backup or instead have a primary battery as a power source. For example, the alarm system 300 can be a single smoke alarm having alarm unit 2000. The alarm system 300 may also be a multiple alarm units 2000 connected together in a network, such as multiple smoke detectors located in a structure. However, the use of the notification nodule 1900 with the EAAM's 1000, 1000a, 1000b, or 1000c described above or below is optional.

Alarms and detectors that are hard wired into a building's main electrical system utilize a backup battery, such as backup battery 2100, to provide temporary power to the alarm or detector when the main power source is unavailable. When these backup batteries run low on power the alarm will chirp intermittently to notify the occupant that the battery is in need of replacement. This warning can occur in the early morning hours when occupants are asleep or during a business meeting, causing undue excitement and a nuisance. This condition is exacerbated when the alarm cannot be accessed without a ladder and the alarm cannot be silenced.

The microprocessor 1906 of the notification module 1900 uses a wireless or hardwired connection to communicate with alarm system 300 to notify the building occupants that the backup battery 2100 in the alarm system 300 has a low charge and is in need of replacement. The alarm system 300 has an alarm unit 2000 configured to detect the battery power level of backup battery 2100 and communicates the battery power level to the microprocessor 1906 via a wireless or hardline connection. For example, the alarm system 300 is wirelessly connected to the notification module 1900 by the communication between antenna 1910 and antenna 310. Antenna 310 is disposed within the alarm system 300 and is in communication with the alarm unit 2000. Antenna 1910 disposed in the notification module housing 1905 and is in communication with the microprocessor 1906. Communication between antenna 1910 and antenna 310 is illustrated as line 1920. The alarm system 300 has a housing 302, and the alarm unit 2000, backup battery 2100, and antenna 310 are disposed within the housing 302. The microprocessor 1906 and antenna 1910 are disposed within the notification module housing 1905.

The housing 1905 of the notification module 1900 has a battery power level display 1902 in communication with the microprocessor 1906. The battery power display 1902 has light emitting diodes (LED's) of different colors corresponding to a certain power level to notify the occupants that backup battery 2100 of alarm system 300 is in need of replacement. The notification module 1900 does not utilize a beeping or chirping notification. Instead, visible LED's 1902 are used. The notification module 1900 is small and can be located in any convenient location, usually at eye level near an entry or exit most commonly used by the occupants, or in a room that is occupied frequently such as a kitchen or living room where the module would be easily seen on a daily basis.

By mounting the notification module 1900 in a highly visible location, the occupant will quickly notice the battery power level display 1902 LED's change from green to yellow, yellow to red, or from green to red to notify the occupant of a low battery situation in the alarm system 300. The LED's may also blink to assist in notifying the building occupant. The charged LED is green, the low battery LED is yellow, and the replace battery LED is red. The LED's are labeled accordingly. The microprocessor 1906 determines which LED on the battery level display 1902 is activated depending on the battery power level communicated to the microprocessor 1906 by the alarm unit 2000 via antennas 1910 and 310. This type of visual system is more user friendly than the chirping alarms currently in use. A low battery situation in a smoke alarm can last for many days without issue and does not require replacement immediately when a low battery notification is utilized. The notification module 1900 will not awaken building occupants in the early hours of the morning. Instead, the occupants will see the change in battery power level displayed by the battery power level display 1902 in the morning, allowing plenty of time to change the battery in need of replacement. The notification module 1900 battery power level display 1902 has a separate LED indicator, which can be labeled unit battery, that is activated when the notification module 1900 battery needs to be changed. The notification module 1900 can also have an optional spare battery compartment 1904 to store an extra battery for the notification module 1900 or alarm for use when the need arises.

The battery power level display 1902 may have one or more LED's having the same or different colors. The individual labels assigned to each LED's may vary. The LED's size, location, and brightness may also vary.

The alarm unit 2000 can be integral with the EAAM cover or the alarm unit 2000 may be a modular component attached to the cover. The alarm unit 2000 can be a smoke, a radon, a carbon monoxide, or a carbon detector or alarm, or a combination of the aforementioned alarms or detectors. The alarm unit 2000 could also be any detector or alarm, or any combination of detector or alarm, reasonably used in the connection of a home or commercial structure. The alarm unit 2000 may have an integral antenna in communication with an antenna 1910 disposed in the notification module 1900. The antenna 1910 is in communication with microprocessor 1906. The wireless communication between the alarm unit 2000 and the microprocessor 1906 might be, for example, a wireless internet connection. The alarm system 300 may be any of the EAAM or incorporate any of the alarm units 2000 described above or below.

The backup battery 2100 is detachable from the EAAM cover. The backup battery 2100 is electrically connected with the alarm unit 2000 and provides a power source when the main power source is unavailable. Once the cover has been removed from its corresponding base, the operator can easily change the backup battery 2100.

In some embodiments, the electrical connectors, such as female electrical connectors 106, and backup battery 2100 may be omitted. Instead, the EAAM has a detachable primary battery that is the sole power source for the electrical components within the EAAM, such as the alarm unit 2000. The primary battery is detachable from the cover and may be replaced in substantially the same way as described above.

In some embodiments, the alarm system 300 will utilize a primary battery as a power source instead of having a backup battery 2100.

In some embodiments, the alarm unit 2000 is detachable from the cover. The alarm unit 2000 may become defective. A defective alarm unit 2000 may be replaced when the cover of any EAAM described above or below in substantially the same was as described above with respect to replacing a backup battery 2100 or primary battery.

In some embodiments, the alarm unit 2000 may be swapped for another suitable alarm unit 2000 in substantially the same way as described above with respect to replacing a backup battery 2100 or primary battery. For example, alarm unit 2000 that is a radon alarm may be replaced with alarm unit 2000 that is a carbon monoxide alarm depending on the needs of the operator. Any suitable alarm unit 2000 for a home or commercial structure may be swapped for another suitable alarm unit 2000.

In some embodiments, the EAAM will not have a beveled access wand recess 202 and will not need an access wand 1700 to attach or detach the cover to or from the base. The cover is removed from the base by hand. This embodiment may be used when the EAAM is located in a convenient location for the operator to change the battery, such as backup battery 2100.

In an alternative embodiment, the cover of the EAAM may have a hinge mechanism with one or more hinge tab 250, corresponding to a hinge mechanism recess having one or more recesses in the base.

In an alternative embodiment of the EAAM, the base locking mechanism is one or more spring loaded ball detent mechanism 102 corresponding to a cover locking mechanism 260 having one or more ball detent locking recesses. In another embodiment of the EAAM, the base locking mechanism is one or more spring loaded pivoting latch locking mechanism 702 corresponding to a cover locking mechanism 860 having one or more latch locking recesses. In another embodiment of the EAAM, the base locking mechanism may be a combination of one or more spring loaded pivoting latch locking mechanism 702 and one or more spring loaded ball detent mechanism 102 corresponding to the respective cover locking mechanisms 260, 860 of the same combination. In an alternative embodiment, the ball 126 may be replaced with a cylindrical pin having a rounded or flat outer surface that can engage the cover locking mechanism with a pin locking recess instead of a ball detent locking recess 260. The cylindrical pin embodiment of the base locking mechanism and cover locking mechanism may be used in combination with the other embodiments of the base locking mechanism and cover locking mechanism. In another embodiment, the base locking mechanism is a tab with a protrusion and the cover locking mechanism is a protrusion recess. The tab with the protrusion makes an interference fit with the cover at the protrusion recess. The flexibility of the tab allows the base locking mechanism to engage and disengage from the cover locking mechanism. The tab, however, may be formed on the cover and the protrusion recess may be formed on the base. In another embodiment, the base locking mechanism is a protrusion formed on the base and the cover locking mechanism is a protrusion recess. The protrusion, however, may be formed on the cover and the protrusion recess may be formed on the base.

Embodiments of the EAAM 1000, 1000*a*, 1000*b*, or 1000*c* may have an optional magnet 104 disposed on the respective base in gap 124. Magnet 104 may be partially or fully embedded in the base or disposed thereon. Magnet 104 may be used to assist in the coupling of the base to the cover. For example, the cover could also have a ferric material or another magnet attached. This ferric material or magnet is placed on the cover to align with the magnet when the cover is coupled with the base. The magnetism helps to couple the cover to the base. The magnet 104 may be placed on the cover and the ferric material and other magnet may be placed instead within the gap 124 on the base.

In an alternative embodiment, the EAAM 1000, 1000*a*, 1000*b*, or 1000*c* has one alignment recess pin in the cover and one corresponding alignment recess 120 in the base to ensure a proper alignment when the base and cover are attached. In another embodiment, the EAAM 1000, 1000*a*, 1000*b*, or 1000*c* has multiple alignment recess pins in the cover and multiple corresponding alignment recesses 120 in the base to ensure a proper alignment when the base and cover are attached. In another embodiment, the alignment pins may be disposed on the base 100 and the alignment pin recesses 120 may be disposed on the cover.

The components can be made from any suitable material, such as a metal or a plastic. The cover and base may be manufactured, for example, by plastic injection molding or by three dimensional printing techniques.

In some embodiments, the access wand 1700 may have more than two latches 1720 pivotally coupled to one another.

In some embodiments, the access wand 1700 may have a camera to assist in engaging the cover of an EAAM in a difficult to reach location. The camera may be coupled to the cover engagement mechanism 1702. For example, the camera may be attached to the support brace 1704. The camera may be in wireless or hardwired communication with a visual display screen, such as a small LED screen for example, attached to the handle body 1712. The screen will allow the operator to see in real time the relative location of the latches 1720 and the beveled access wand recess 202. The screen and camera will help the operator guide the latches 1720 into the beveled access wand recess 202.

In one example, a modular alarm unit having a cover and a base is provided. The cover having a cover locking mechanism, and a hinge mechanism disposed at a first end of the cover, the hinge mechanism having at least one hinge tab. The base having a base locking mechanism configured to engage with the corresponding cover locking mechanism to lock the base to the cover, and a hinge mechanism recess disposed at one end of the base, the hinge mechanism recess having at least one recess, wherein the hinge mechanism recess is configured to receive the hinge mechanism. The cover is configured to be coupled to the base by the engagement of the hinge mechanism with the hinge mechanism recess and the engagement of the cover locking mechanism with the base locking mechanism.

Additionally or alternatively, the hinge mechanism may include two hinge tabs and the hinge mechanism recess may include two recesses corresponding to the two hinge tabs.

Additionally or alternatively, the base locking mechanism may be two or more spring loaded ball detent mechanisms having a spring and a ball, wherein the spring is attached to the base at one end and attached to the ball at the other end.

Additionally or alternatively, the base locking mechanism may be two or more spring loaded pivoting latch locking mechanism having a spring and a latch. The spring is attached to the latch at one end and attached to the base at the other end, and the latch is pivotally coupled to the base.

Additionally or alternatively, the cover locking mechanism includes two or more ball detent locking recesses configured to engage with the base locking mechanism having two or more spring loaded ball detent mechanism to lock the cover to the base.

Additionally or alternatively, the cover locking mechanism is two or more latch locking recesses configured to engage with the base locking mechanism having two or more spring loaded pivoting latch locking mechanisms to lock the cover to the base.

Additionally or alternatively, the cover includes a beveled access wand recess.

Additionally or alternatively, the modular alarm having an access wand. The access wand further having a tubular body, a lever movable from a first position to a second position, a cover engagement mechanism having at least two latches, and actuation cable disposed in the tubular body. The cover engagement mechanism having an extended position and an unextended position. The actuation cable is attached to the lever at one end and to the cover engagement mechanism at the other end, wherein the actuation cable is configured to move the cover engagement mechanism from the extended position to the unextended position when the lever is moved from the first position to the second position. The cover engagement mechanism is configured to be inserted into the beveled access wand recess when the cover engagement mechanism is in the unextended position.

Additionally or alternatively, the access wand is configured to engage the cover when the cover locking mechanism is in the extended position.

Additionally or alternatively, the cover is detachably coupled to the base.

Additionally or alternatively, the cover having an alarm unit and a battery, wherein the battery is detachable from the cover.

In one example, a modular alarm unit having a cover, a base, and an access wand. The cover having a cover locking mechanism and a beveled access wand recess. The base having a base locking mechanism. The access wand having a cover engagement mechanism configured to engage the cover at the beveled access wand recess.

Additionally or alternatively, the access wand further having a tubular body, a lever movable from a first position to a second position, the cover engagement mechanism having at least two latches, and an actuation cable disposed in the tubular body. The cover engagement mechanism having an extended position and an unextended position. The actuation cable attached to the lever at one end and to the cover engagement mechanism at the other end. The actuation cable is configured to move the cover engagement mechanism from the extended position to the unextended position when the lever is moved from the first position to the second position, and wherein the actuation cable is configured to move the cover engagement mechanism from the unextended position to the extended position when the lever is moved from the second position to the first position. The cover engagement mechanism is configured to be inserted into the beveled access wand recess when the cover engagement mechanism is in the unextended position.

Additionally or alternatively, the access wand configured to engaged the cover at the beveled access wand recess when the cover locking mechanism is in the extended position.

Additionally or alternatively, the cover locking mechanism is two or more ball detent locking recesses configured to engage with the base locking mechanism having two or more spring loaded ball detent mechanism to lock the cover to the base.

Additionally or alternatively, the cover locking mechanism is two or more latch locking recesses configured to engage with the base locking mechanism having two or more spring loaded pivoting latch locking mechanisms to lock the cover to the base.

In one example, an access wand for use with a modular alarm unit. The access wand having a tubular body, a lever movable from a first position to a second position, a cover engagement mechanism having at least two latches, and an actuation cable disposed in the tubular body. The cover engagement mechanism having an extended position and an unextended position. The actuation cable attached to the lever at one end and to the cover engagement mechanism at the other end.

Additionally or alternatively, the actuation cable is configured to move the cover engagement mechanism from the extended position to the unextended position when the lever is moved from the first position to the second position. The actuation cable is further configured to move the cover mechanism from the unextended position to the extended position when the lever is moved from the second position to the first position.

Additionally or alternatively, the modular alarm mount has a cover having a beveled access wand recess. The cover engagement mechanism is configured to be inserted into a beveled access wand recess when the cover engagement mechanism is in the unextended position.

Additionally or alternatively, the access wand configured to engage the cover at the beveled access wand recess when the cover locking mechanism is in the extended position.

In one example, a notification module having a housing. The housing having a battery power level display, a microprocessor disposed in the housing and in communication with an alarm system and the battery power level display. The alarm system having a battery. The microprocessor is configured to detect a battery power level of the battery and displays the battery power level on the battery power level display.

Additionally or alternatively, the microprocessor of the alarm system is in communication with an antenna disposed in the notification module housing. The antenna disposed in the notification module housing is in communication with another antenna within the alarm system housing. The antenna disposed in the alarm system housing is in communication with an alarm unit.

In one example, a method of attaching an alarm unit cover to the alarm unit base. Engaging the cover with an access wand, wherein the access wand is partially inserted into a beveled access wand recess formed in the cover. Then, moving the cover adjacent the base with the access wand. Then, inserting one or more hinge tabs formed at one end of the cover with the access wand into one or more recesses formed at one end of the base. Then, rotating the cover with the access wand relative to the base after the one or more hinge tabs are inserted into the one or more recesses to engage a base locking mechanism with a cover locking mechanism. Then, locking the cover to the base by the engagement of the base locking mechanism and the cover locking mechanism.

In one example, a method of attaching an alarm unit cover to the alarm unit base. Engaging the cover with an access wand, wherein the access wand is partially inserted into a beveled access wand recess formed in the cover. Then, moving the cover adjacent the base with the access wand. Then, engaging the base locking mechanism with the cover locking mechanism by using the access wand, wherein the cover is locked to the base by the engagement of the base locking mechanism and the cover locking mechanism.

It is contemplated that elements and features of one embodiment may be beneficially incorporated in other embodiments without further recitation.

While the foregoing is directed to embodiments of the present disclosure, other and further embodiments of the disclosure may be devised without departing from the basic scope thereof, and the scope thereof is determined by the claims that follow.

What is claimed is:

1. A modular alarm unit comprising:
   a cover further comprising:
      a cover locking mechanism,
      a beveled access wand recess, and
      a hinge mechanism disposed at a first end of the cover, the hinge mechanism having at least one hinge tab;

a base further comprising:
  a base locking mechanism configured to engage with the corresponding cover locking mechanism to lock the base to the cover, and
  a hinge mechanism recess disposed at one end of the base, the hinge mechanism recess having at least one recess, wherein the hinge mechanism recess is configured to receive the hinge mechanism; and
an access wand further comprising:
  a tubular body;
  a lever movable from a first position to a second position,
  a cover engagement mechanism having an unextended position in which the cover engagement mechanism is moveable into and out of the beveled access wand recess and an extended position in which the cover engagement mechanism is not moveable into and out of the beveled access wand recess, and
  an actuation cable disposed in the tubular body and attached to the lever at one end and to the cover engagement mechanism at the other end so that the cover engagement mechanism moves from the extended position to the unextended position when the lever is moved from the first position to the second position;
  wherein the cover is configured to be coupled to the base by the engagement of the hinge mechanism with the hinge mechanism recess and the engagement of the cover locking mechanism with the base locking mechanism.

2. The modular alarm unit of claim 1, wherein the hinge mechanism comprises two hinge tabs and the hinge mechanism recess comprises two recesses corresponding to the two hinge tabs.

3. The modular alarm unit of claim 1, wherein the base locking mechanism is two or more spring loaded ball detent mechanisms having a spring and a ball, wherein the spring is attached to the base at one end and attached to the ball at the other end.

4. The modular alarm unit of claim 1, wherein the base locking mechanism is two or more spring loaded pivoting latch locking mechanism having a spring and a latch, wherein the spring is attached to the latch at one end and attached to the base at the other end, and the latch is pivotally coupled to the base.

5. The modular alarm unit of claim 1, wherein the cover locking mechanism is two or more ball detent locking recesses configured to engage with the base locking mechanism having two or more spring loaded ball detent mechanism to lock the cover to the base.

6. The modular alarm unit of claim 1, wherein the cover locking mechanism is two or more latch locking recesses configured to engage with the base locking mechanism having two or more spring loaded pivoting latch locking mechanisms to lock the cover to the base.

7. The modular alarm unit of claim 1, wherein the access wand configured to engaged the cover when the cover locking mechanism is in the extended position.

8. The modular alarm unit of claim 1, wherein the cover is detachably coupled to the base.

9. The modular alarm unit of claim 1, the cover having an alarm unit and a battery, wherein the battery is detachable from the cover.

10. The modular alarm unit of claim 1, wherein the cover engagement mechanism comprises at least two latches.

11. A modular alarm unit comprising:
  a cover having a cover locking mechanism and a beveled access wand recess,
  a base having a base locking mechanism, and
  an access wand having a cover engagement mechanism configured to engage the cover at the beveled access wand recess, a tubular body, a lever movable from a first position to a second position, a cover engagement mechanism having an extended position and an unextended position, and an actuation cable disposed in the tubular body and attached to the lever at one end and to the cover engagement mechanism at the other end,
  wherein the actuation cable is configured to move the cover engagement mechanism from the extended position to the unextended position when the lever is moved from the first position to the second position, and
  wherein the cover engagement mechanism is configured to be inserted into the beveled access wand recess when the cover engagement mechanism is in the unextended position.

12. The modular alarm unit of claim 11, wherein the access wand is further configured to engage the cover at the beveled access wand recess when the cover locking mechanism is in the extended position.

13. The modular alarm unit of claim 11, wherein the cover locking mechanism is two or more ball detent locking recesses configured to engage with the base locking mechanism having two or more spring loaded ball detent mechanism to lock the cover to the base.

14. The modular alarm unit of claim 11, wherein the cover locking mechanism is two or more latch locking recesses configured to engage with the base locking mechanism having two or more spring loaded pivoting latch locking mechanisms to lock the cover to the base.

15. The modular alarm unit of claim 11, wherein the cover engagement mechanism comprises at least two latches.

16. The modular alarm unit of claim 11, wherein the actuation cable is configured to move the cover engagement mechanism from the unextended position to the extended position when the lever is moved from the second position to the first position.

17. An access wand for use with a modular alarm unit comprising:
  a tubular body;
  a lever movable from a first position to a second position;
  a cover engagement mechanism having at least two latches, the cover engagement mechanism having an extended position and an unextended position; and
  an actuation cable disposed in the tubular body and attached to the lever at one end and to the cover engagement mechanism at the other end.

18. The access wand for use with a modular alarm unit of claim 17, wherein the actuation cable is configured to move the cover engagement mechanism from the extended position to the unextended position when the lever is moved from the first position to the second position, and wherein the actuation cable is configured to move the cover mechanism from the unextended position to the extended position when the lever is moved from the second position to the first position.

19. The access wand for use with a modular alarm unit of claim 18, wherein the modular alarm mount has a cover having a beveled access wand recess, and the cover engagement mechanism is configured to be inserted into a beveled access wand recess when the cover engagement mechanism is in the unextended position.

20. The access wand for use with a modular alarm unit of claim 19, wherein the access wand configured to engaged the cover at the beveled access wand recess when the cover locking mechanism is in the extended position.

* * * * *